United States Patent
Ikemoto et al.

(10) Patent No.: US 10,154,227 B2
(45) Date of Patent: Dec. 11, 2018

(54) DISPLAY DEVICE AND TELEVISION RECEIVER

(71) Applicant: Sharp Kabushiki Kaisha, Sakai, Osaka (JP)

(72) Inventors: Masao Ikemoto, Sakai (JP); Hitoshi Hasegawa, Sakai (JP); Yuki Amano, Sakai (JP); Katsushi Maeta, Sakai (JP); Keiichi Ohhashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 21 days.

(21) Appl. No.: 15/316,184

(22) PCT Filed: May 21, 2015

(86) PCT No.: PCT/JP2015/064637
§ 371 (c)(1),
(2) Date: Dec. 5, 2016

(87) PCT Pub. No.: WO2015/186529
PCT Pub. Date: Dec. 10, 2015

(65) Prior Publication Data
US 2017/0155869 A1    Jun. 1, 2017

(30) Foreign Application Priority Data

Jun. 6, 2014 (JP) .................................. 2014-117929
Mar. 18, 2015 (JP) .................................. 2015-054859

(51) Int. Cl.
*F16M 11/00* (2006.01)
*H04N 5/64* (2006.01)
(Continued)

(52) U.S. Cl.
CPC ............... *H04N 5/64* (2013.01); *F16M 11/22* (2013.01); *H04N 5/44* (2013.01); *H05K 5/0017* (2013.01);
(Continued)

(58) Field of Classification Search
CPC .......... H04N 5/64; H04N 5/44; H05K 5/0234; H05K 5/0204; H05K 5/0017;
(Continued)

(56) References Cited

U.S. PATENT DOCUMENTS 4,799,448 A * 1/1989 Junker .................... E01F 9/692
116/63 P
6,967,668 B2 * 11/2005 Byoun ................... F16M 11/22
345/55

(Continued)

FOREIGN PATENT DOCUMENTS

JP      2007-310318 A    11/2007
JP      4092589 B2        5/2008

*Primary Examiner* — Ingrid M Weinhold
(74) *Attorney, Agent, or Firm* — Keating & Bennett, LLP

(57) ABSTRACT

The display device includes two stands 1 that support a chassis (holder). The stand has a strut, and the strut is fixed to the chassis with a fixing portion that encloses a back side and both horizontal sides of the strut. A first projected portion, which projects toward the strut, is formed on a second plate-like member positioned at one side of the strut, and a second projected portion, which projects at a position nearer to the back compared to the first projected portion, is formed on a third plate-like member positioned at the other side. Between the two fixing portions, positions of the second plate-like member and the third plate-like member are in reverse to each other. Due to difference in the positions of the first projected portion and the second projected portion, the two stands cannot be attached at reverse positions. Once the orientation of one fixing portion is reversed, (Continued)

one fixing portion becomes the other fixing portion, and the two fixing portions are common components.

4 Claims, 17 Drawing Sheets

(51) Int. Cl.
*F16M 11/22* (2006.01)
*H04N 5/44* (2011.01)
*H05K 5/00* (2006.01)
*H05K 5/02* (2006.01)
*H05K 7/14* (2006.01)

(52) U.S. Cl.
CPC ......... *H05K 5/0204* (2013.01); *H05K 5/0234* (2013.01); *H05K 7/1417* (2013.01)

(58) Field of Classification Search
CPC .. H05K 7/1417; F16M 2200/08; F16M 11/22; G06F 1/166; A47B 91/00; A47B 91/005; F16B 7/0406; F16B 7/0413; F16B 7/042
USPC ................ 248/188.8, 688, 677, 346.01, 917; 40/607.1; 403/11, 13, 14, 232.1, 383, 403/387; 361/679.02, 679.59; 312/223.1, 312/223.2
See application file for complete search history.

(56) References Cited

U.S. PATENT DOCUMENTS

| | | | | |
|---|---|---|---|---|
| 7,287,729 B2 * | 10/2007 | Jung | ...................... | F16M 11/10 248/122.1 |
| D580,196 S * | 11/2008 | Yamaguchi | .................... | D6/708 |
| 7,614,596 B2 * | 11/2009 | Takao | ................... | F16M 11/10 248/176.3 |
| 7,742,288 B2 * | 6/2010 | Min | ...................... | F16M 11/22 248/125.8 |
| 7,789,362 B2 * | 9/2010 | Choi | ...................... | F16M 11/10 248/276.1 |
| 7,907,391 B2 * | 3/2011 | Park | ...................... | F16M 11/22 361/679.21 |
| 7,986,373 B2 * | 7/2011 | Maruta | .................. | F16M 11/22 348/794 |
| 8,000,092 B2 * | 8/2011 | Kim | ...................... | F16M 11/22 248/917 |
| 8,418,987 B2 * | 4/2013 | Kakuta | ................ | F16M 13/005 248/917 |
| 8,490,931 B2 * | 7/2013 | Takao | .................... | F16M 11/22 108/150 |
| 8,614,884 B2 * | 12/2013 | Hsu | ........................ | F16M 11/22 248/917 |
| 8,654,526 B2 * | 2/2014 | Wu | .......................... | H04N 5/64 248/188 |
| 8,740,169 B2 * | 6/2014 | Sawai | ................ | F16M 11/2014 248/346.01 |
| 8,794,645 B2 * | 8/2014 | Tang | ....................... | H04N 5/64 280/79.7 |
| D714,281 S * | 9/2014 | Reznik | ........................ | D14/251 |
| 9,562,643 B2 * | 2/2017 | Liu | ........................ | F16M 11/22 |
| 2003/0103092 A1 * | 6/2003 | Byoun | ................... | F16M 11/22 715/866 |
| 2004/0165344 A1 * | 8/2004 | Lee | ....................... | F16M 11/041 361/679.21 |
| 2005/0050784 A1 * | 3/2005 | Bang | ..................... | F16M 11/22 40/607.01 |
| 2005/0237438 A1 * | 10/2005 | Maruta | ................. | G06F 1/1601 348/797 |
| 2006/0087596 A1 * | 4/2006 | Park | ....................... | F16M 11/22 348/739 |
| 2006/0208145 A1 * | 9/2006 | Chen | ..................... | F16M 11/046 248/289.11 |
| 2006/0290832 A1 * | 12/2006 | Lin | ........................ | F16M 11/10 349/58 |
| 2007/0047188 A1 * | 3/2007 | Kim | ....................... | F16M 11/22 361/679.22 |
| 2007/0090233 A1 * | 4/2007 | Choi | ..................... | F16M 11/10 248/122.1 |
| 2007/0103605 A1 * | 5/2007 | Maruta | .................. | F16M 11/22 348/797 |
| 2007/0145212 A1 | 6/2007 | Yamanaka | | |
| 2008/0239643 A1 * | 10/2008 | Min | ....................... | F16M 11/22 361/679.05 |
| 2009/0095870 A1 * | 4/2009 | Chang | .................... | F16M 11/22 248/440 |
| 2009/0114792 A1 * | 5/2009 | Ri | .......................... | F16M 11/08 248/423 |
| 2009/0121097 A1 * | 5/2009 | Takao | .................... | F16M 11/10 248/158 |
| 2010/0193648 A1 * | 8/2010 | Takao | .................... | F16M 11/22 248/163.1 |
| 2011/0073738 A1 * | 3/2011 | Takao | .................... | F16M 11/10 248/397 |
| 2013/0107430 A1 * | 5/2013 | Wu | ........................ | H04N 5/64 361/679.01 |
| 2013/0271903 A1 * | 10/2013 | Takao | .................... | F16M 11/22 361/679.01 |
| 2014/0204564 A1 * | 7/2014 | Mukaide | .................. | H04N 5/64 362/97.1 |
| 2014/0239133 A1 * | 8/2014 | Burns | .................... | F16M 11/04 248/121 |

\* cited by examiner

|  | PRESENT INVENTION | COMPARISON TARGET |
|---|---|---|
| (1) | 20 mm | 20 mm |
| (2) | 20 mm | 20 mm |
| (3) | 11 mm | 13 mm | ved with a stand. In a display device of which a stand is disposed in the middle of a lower side thereof, the possibility of falling entailed by an increase in the size of the display device grows, and thus the size of the stand is increased in order to prevent falling. In response to the increase in the size of the display device, a need for disposing two stands being spaced apart from each other in the right and left has arisen. In Japanese Patent No. 4092589, a display device provided with two stands is disclosed.

DISPLAY DEVICE AND TELEVISION RECEIVER

CROSS-REFERENCE TO RELATED APPLICATIONS

This application is the national phase under 35 U.S.C. § 371 of PCT International Application No. PCT/JP2015/064637 which has an International filing date of May 21, 2015 and designated the United States of America.

FIELD

The present invention relates to a display device, provided with two stands, and a television receiver.

BACKGROUND

Some of thin display devices, including a liquid crystal display and an electroluminescence (EL) display, are provided with a stand. In a display device of which a stand is disposed in the middle of a lower side thereof, the possibility of falling entailed by an increase in the size of the display device grows, and thus the size of the stand is increased in order to prevent falling. In response to the increase in the size of the display device, a need for disposing two stands being spaced apart from each other in the right and left has arisen. In Japanese Patent No. 4092589, a display device provided with two stands is disclosed.

In addition, the stands are designed so as to be capable of supporting a housing while maintaining the balance of the display device according to the center of gravity. For this reason, in a case where the stands are attached to the housing in an orientation different from a specified orientation, the stand cannot support the housing well, and thus the display device might fall easily.

Therefore, a display device in which a stand is made impossible to be attached in the wrong orientation to a housing is disclosed in Japanese Patent Laid-Open Publication No. 2007-310318.

SUMMARY

In general, a display device is packaged with stands thereof being removed from a housing, and a user who purchased the display device attaches the stands to the housing. At that time, the user might attach the two stands at positions in reverse to the right positions. In a case where the stands are attached in the reverse positions, the housing cannot be supported appropriately and thus the display device might fall since the stands are configured to be capable of appropriately supporting the housing in a state of being attached in the right positions. For this reason, the stands are required to be prevented from being attached with right and left reversed. By making the shapes of components or the fixed positions of components different in terms of right and left, the two stands can be prevented from being attached with right and left reversed. However, there is a problem of rising manufacturing costs of the display device since the shapes of components are different in terms of right and left.

The present disclosure is made in view of such circumstances, and an object is to provide a display device and a television receiver which allow preventing two stands from being attached with right and left reversed while restricting manufacturing costs.

In addition, in response to a trend of making a thinner display device, there is a need for narrowing a strut portion of a stand and for miniaturizing an attaching portion for attaching the strut portion. Because of this, there is a problem in which a decrease in the strength of the stand and the attaching portion and a decrease in the rigidity of the display device result in frequent occurrence of deformation. Accordingly, the rigidity of the display device is required to be secured in a case where the display device is made thinner.

The present disclosure is made in view of such circumstances, and an object is to provide the display device and the television receiver which prevents stands from being attached in the wrong orientations and of which rigidity is secured.

A display device according to an aspect of the present disclosure includes a display unit that displays an image on a front side, a holder that is positioned in back of the display unit and holds the display unit, two stands, each of which has a strut, and two fixing portions that are attached to a back portion of the holder and each of which is for fixing the strut to the holder by enclosing a back side and both horizontal sides of the strut. In the display device, each of the two fixing portions includes a first plate-like member which is positioned in back of the fixed strut, a second plate-like member which is positioned at one of both sides of the strut and in which a first projected portion projecting toward the strut is formed in an axial direction of the strut, a third plate-like member which is positioned at the other one of both sides of the strut and in which a second projected portion projecting toward the strut is formed in the axial direction of the strut at a position nearer to the back compared to the first projected portion. In addition, between the two fixing portions, positions of the second plate-like member and the third plate-like member with respect to the strut are in reverse to each other.

In the display device according to an aspect of the present disclosure, a first groove that engages with the first projected portion is formed in the axial direction only in one of both side portions of the strut and a second groove that engages with the second projected portion is formed in the axial direction only in the other one of both side portions of the strut. In addition, between the two stands, positions of side portions of the strut, in which the first groove and the second groove are formed, are in reverse to each other.

In the display device according to an aspect of the present disclosure, a penetration portion through which a screw for fixing the strut penetrates is formed in the first plate-like member, a screw hole in which the screw is screwed is formed in the back side of the strut, and a screw hole is not formed in a front side of the strut.

A display device according to an aspect of the present disclosure includes a display unit that displays a motion picture on a front side, a holder that holds the display unit, a stand that has a strut portion attached along a back portion of the holder and supports the holder, and an attaching portion for enclosing a back side and both horizontal sides of the strut portion and attaching the strut portion to the holder. In the display device, the attaching portion has a plate-like back side member which is positioned in back of the attached strut portion, a plate-like first side member which is position at one of both horizontal sides of the strut portion and in which a third projected portion, a part of the first side member projecting toward the inside, is formed in a longitudinal direction of the strut portion, and a plate-like second side member which is positioned at the other one of both horizontal sides of the strut portion and in which a fourth projected portion, a part of the second side member projecting toward the inside, is formed in the longitudinal direction of the strut portion so as to have a length in a front-and-back direction smaller than that of the third projected portion. In addition, the strut portion has an opening portion which is opened from tips thereof in the longitudinal direction by a distance exceeding a length of the third projected portion in the front-and-back direction such that the third projected portion is interposed in the front-and-back direction and a recessed portion, which is recessed in the longitudinal direction and engages with the fourth projected portion at a position on a side opposite to the opening portion, with a length in the front-and-back direction being smaller than that of the third projected portion and greater than that of the fourth projected portion.

In the display device according to an aspect of the present disclosure, either the two stands, each of which has the strut portion, are included, or the stand has two strut portions. In addition, the two attaching portions are provided in parallel on the back portion of the holder, and positions of the first side member and the second side member in a horizontal direction with respect to the strut portion attached to each of the two attaching portions are in reverse to each other.

In the display device according to an aspect of the present disclosure, the attaching portion is shaped symmetrically in the longitudinal direction of the attached strut portion, and the strut portion is shaped symmetrically in the front-and-back direction in a state of being attached.

In the display device according to an aspect of the present disclosure, the first side member and the second side member have the third projected portion and the fourth projected portion formed on portions that do not include ends, and the strut portion has a plurality of extended portions, which are parts of tips of the strut portion extended longer than other portions and tilted toward the center.

A television receiver according to an aspect of the present disclosure includes the display device according to an aspect of the present disclosure, a reception unit that receives a television broadcast, in which the display device displays a motion picture based on the television broadcast received with the reception unit.

In an aspect of the present disclosure, the shape of the fixing portion prevents the two stands from being attached to the housing in the reverse positions. In addition, the two fixing portions are realized by common components being disposed in reverse orientations. Accordingly, the display device of the aspect of the present disclosure brings about a remarkable effect of allowing preventing the two stands from being attached with right and left reversed while restricting manufacturing costs.

The above and further objects and features will more fully be apparent from the following detailed description with accompanying drawings.

DETAILED DESCRIPTION

Hereinafter, the present disclosure will be described in detail with reference to the drawings which illustrate embodiments thereof.

<First Embodiment>

Figure 1:
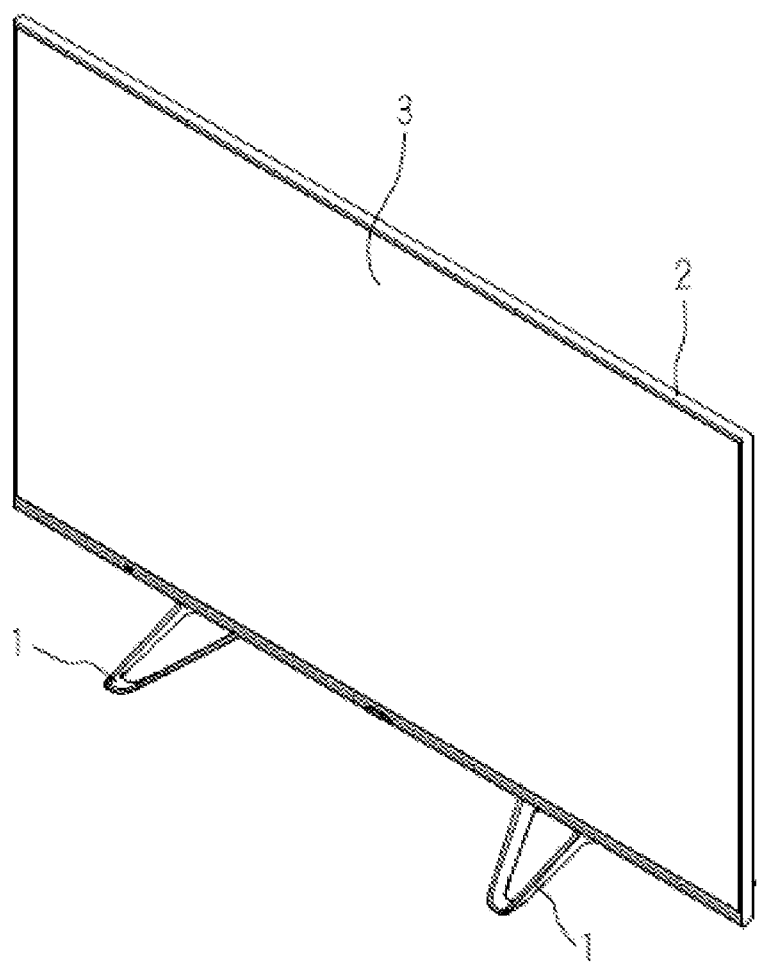
FIG. 1 is a schematic perspective view of a display device.

FIG. 1 is a schematic perspective view of a display device. The display device is configured as a thin display device of which a length in a front-and-back direction is significantly smaller than a length in the other direction, which is orthogonal to the front-and-back direction. The display device is provided with a display unit 3 including a display panel such as a liquid crystal display and an EL panel. The display unit 3 displays an image on a front surface thereof using the display panel. The display unit 3 is a rectangular flat plate, and is accommodated in a housing 2. The housing 2 is in a thin rectangular parallelepiped shape. The housing 2 accommodates the display unit 3 such that a display surface of the display unit 3 is exposed to the front. A direction along a shorter side of the display unit 3 will be referred to as an up-and-down direction, and a direction along a longer side thereof will be referred to as a right-and-left direction (horizontal direction). A lower surface of the housing 2 is a surface along the longer side of the display unit 3.

The display device is further provided with two stands 1 that support the display unit 3 from below. The display device is further provided with other components (not illustrated), including a reception unit, an input and output interface, an image processing unit, a speaker, and a power supply, and is configured as a television receiver according to the present disclosure. The reception unit (not illustrated) receives a television broadcast, and the display unit 3 displays an image based on the television broadcast received with the reception unit. The television receiver according to the present disclosure may be in a form provided with a reception unit separated from the display device. In addition, the display device according to the embodiment may be a display device other than the television receiver.

Figure 2:
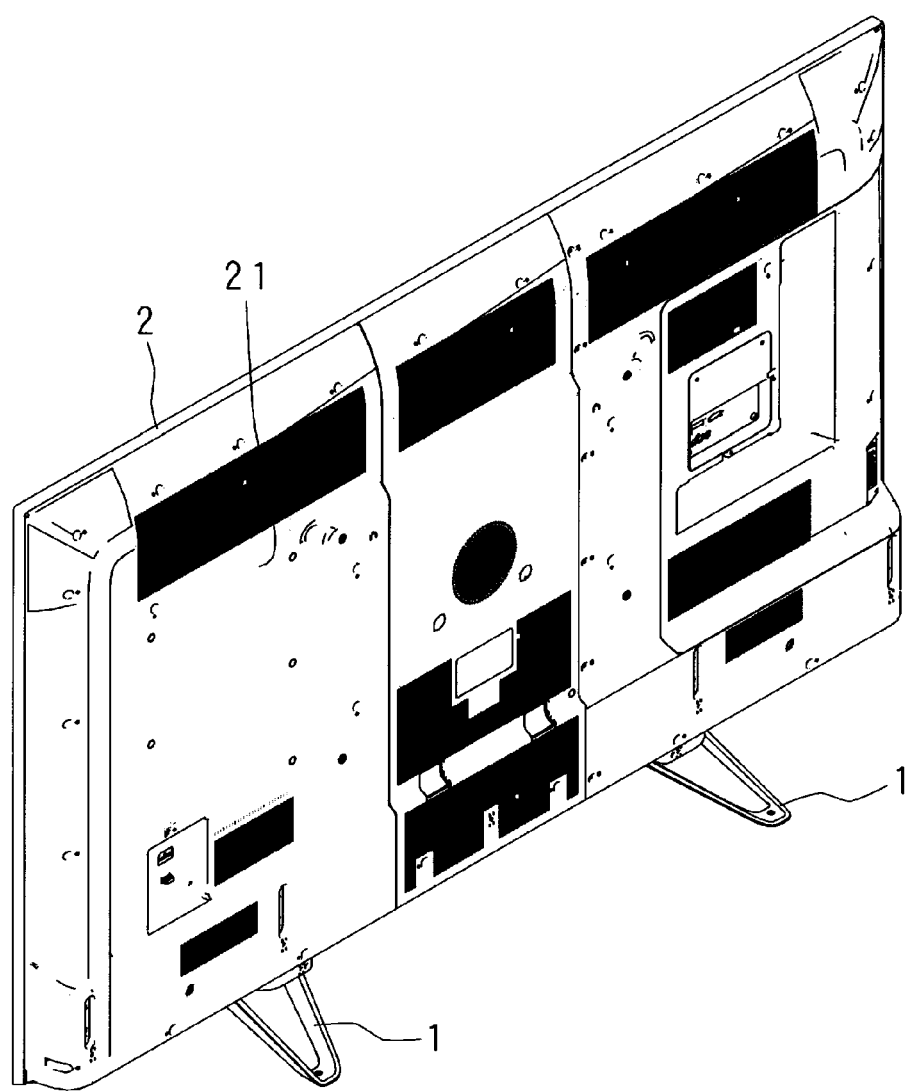
FIG. 2 is a schematic perspective view illustrating a back side of the display device.
Figure 3:
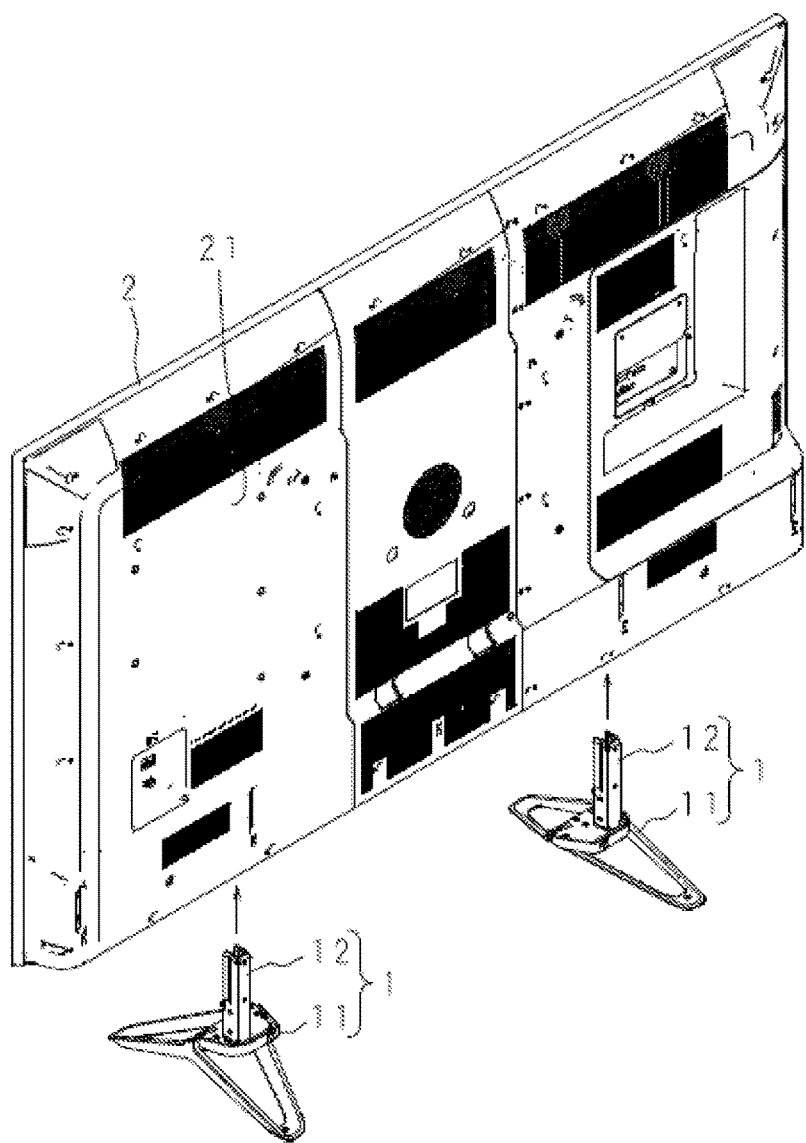
FIG. 3 is a schematic perspective view illustrating the back side of the display device.

FIG. 2 and FIG. 3 are schematic perspective views illustrating a back side of the display device. FIG. 3 illustrates a state where the stand 1 is yet to be attached. The housing 2 includes a rear cabinet 21 that configures the back surface of the display device. The stand 1 has a leg portion 11 that is in contact with a mounting surface, including a floor, and a strut 12 fixed to the leg portion 11. The strut 12 is in the up-and-down direction which intersects the front-and-back direction and the horizontal direction. Two insertion-holes into which two struts 12 are inserted are formed in the lower surface of the housing 2. As indicated by arrows in FIG. 3, the strut 12 is inserted into each insertion-hole and the strut 12 is fixed by a screw being screwed from the back of the rear cabinet 21.

Figure 4:
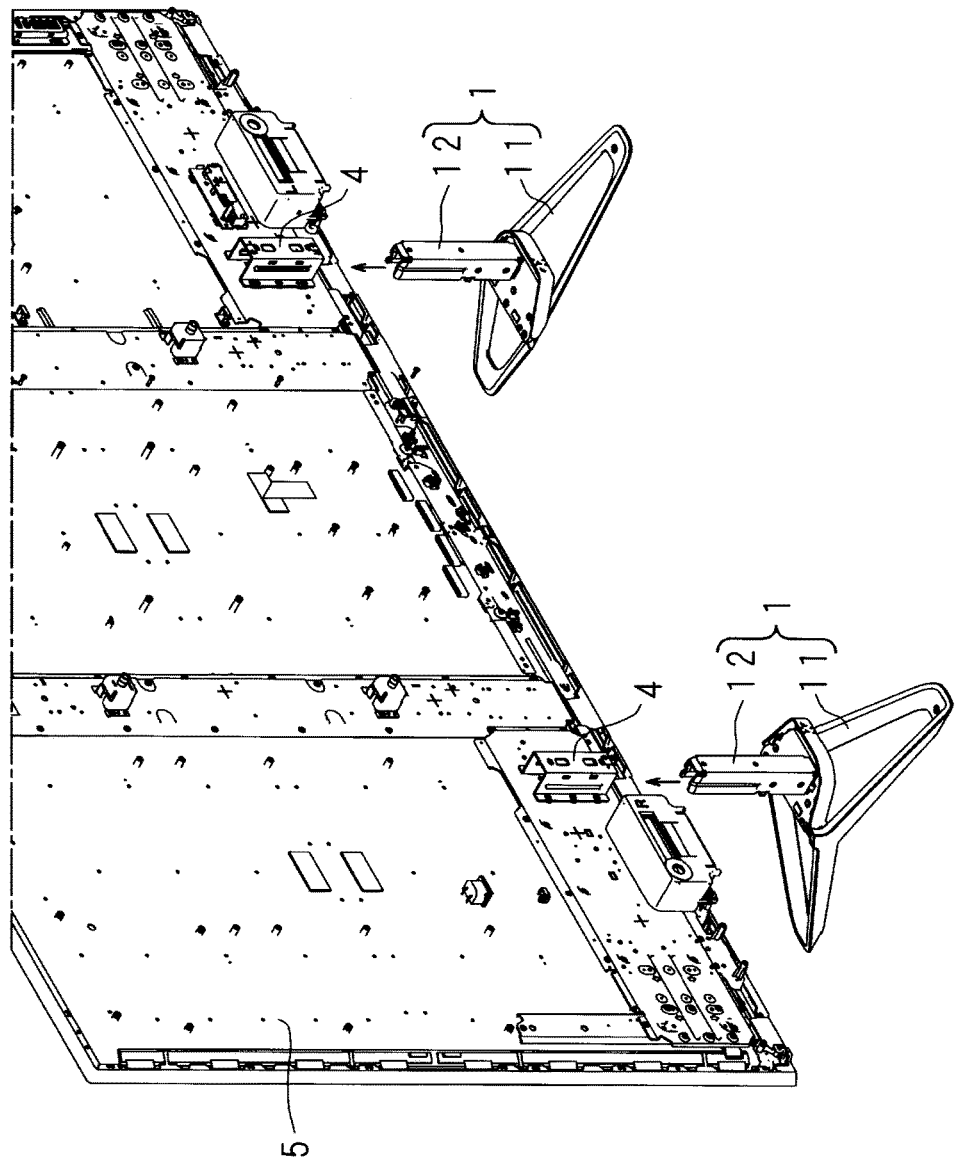
FIG. 4 is a schematic perspective view illustrating the back side of the display device from which a rear cabinet is removed.

FIG. 4 is a schematic perspective view illustrating the back side of the display device from which the rear cabinet 21 is removed. FIG. 4 illustrates a state where the stand 1 is yet to be attached to the housing 2. In reality, the stand 1 is attached to the housing 2 in a state where the rear cabinet 21 is present. A chassis (holder) 5 that holds the display unit 3 is provided within the housing 2. The chassis 5 is substantially formed in a plate shape and is disposed on the back of the display unit 3 to hold the display unit 3 from the back. Two fixing portions 4 for fixing each of the struts 12 are provided on a back portion of the chassis 5.

Figure 5:
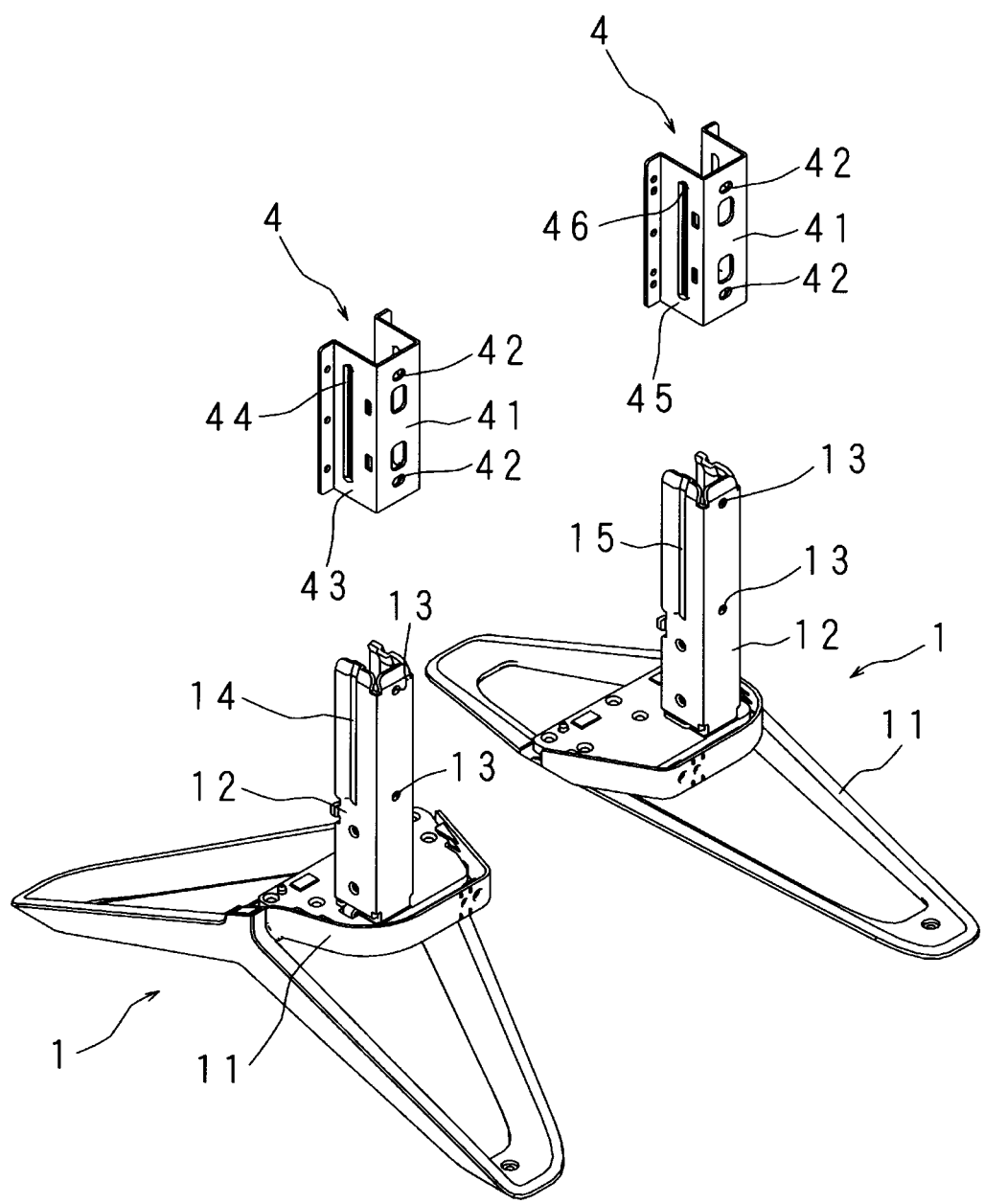
FIG. 5 is a schematic perspective view illustrating fixing portions and stands.
Figure 6:
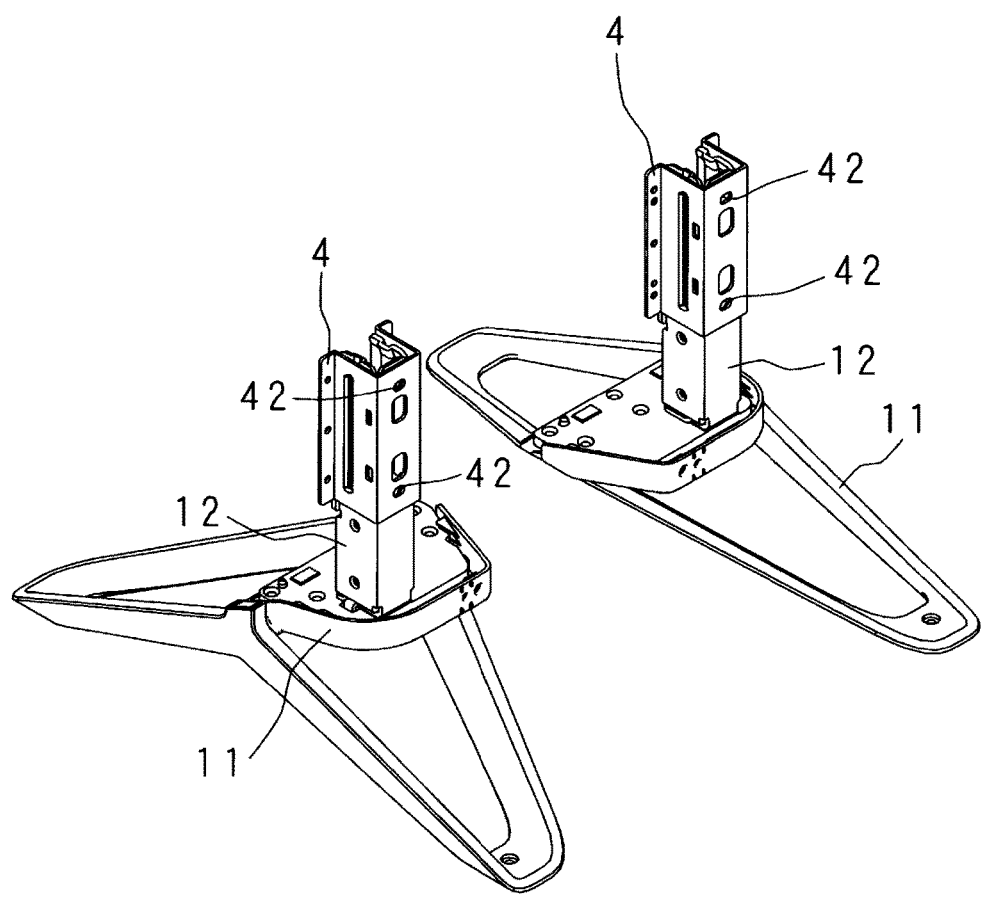
FIG. 6 is a schematic perspective view illustrating the fixing portions and the stands.

FIG. 5 and FIG. 6 are schematic perspective views illustrating the fixing portions 4 and the stands 1. FIG. 6 illustrates a state where the stand 1 is fixed to the fixing portion 4. The fixing portion 4 is a long member, and a section thereof, which is orthogonal to a longitudinal direction, is formed in a U-shape. The fixing portion 4 is attached to the back surface of the chassis 5 such that a U-shaped opening side faces the front. A position of the fixing portion 4 in the horizontal direction corresponds to a position of the insertion-hole provided on the lower surface of the housing 2. The strut 12 is inserted into the housing 2 from the insertion-hole by being inserted into a rectangular-tube-like portion formed of the fixing portion 4 and the back surface of the chassis 5 as indicated by the arrows in FIG. 4. The back side and both horizontal sides of the inserted strut 12 are enclosed with the fixing portion 4, and the front side is enclosed with the chassis 5. The two fixing portions 4 are disposed in parallel with the longitudinal direction thereof being in the up-and-down direction such that the two struts 12 are inserted in parallel. The fixing portion 4 has a first plate-like member 41 positioned in back of the fixed strut 12. A through-hole (penetration portion) 42 is formed in the first plate-like member 41. In addition, a screw hole 13 is formed in the back side of the strut 12. The strut 12 is fixed to the fixing portion 4 by a screw being screwed in from the back of the rear cabinet 21 and the screw being screwed with the screw hole 13 in a state where the strut 12 is inserted into the fixing portion 4. In a state where the strut 12 is fixed, the longitudinal direction of the fixing portion 4 coincides with an axial direction of the strut 12. In this way, the stand 1 is attached to the chassis 5. The attached stand 1 supports the display unit 3 and the chassis 5 from below.

Figure 7:
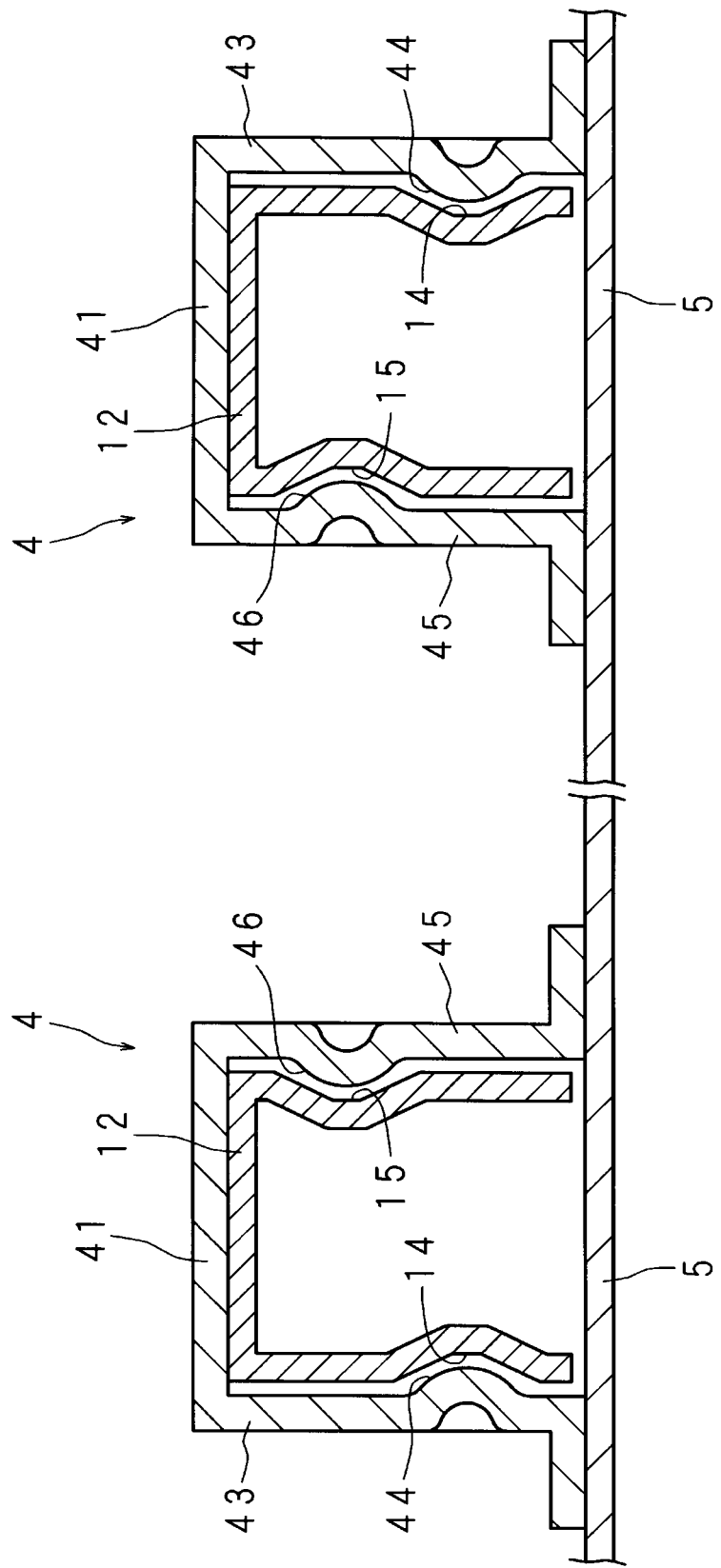
FIG. 7 is a sectional view of the fixing portions and struts according to a first embodiment.

FIG. 7 is a sectional view of the fixing portions 4 and the struts 12 according to the first embodiment. FIG. 7 illustrates a state where the strut 12 is fixed to the fixing portion 4. In addition, FIG. 7 illustrates a section of the strut 12, which is orthogonal to the axial direction thereof. The lower side of FIG. 7 corresponds to the front of the display device, and the upper side corresponds to the back of the display device. As described above, the section of the fixing portion 4, of which the front side is opened, is formed in a U-shape. The fixing portion 4 has the plate-like first plate-like member 41 positioned in back of the fixed strut 12 and a second plate-like member 43 and a third plate-like member 45 that are positioned at both sides of the strut 12. The second plate-like member 43 and the third plate-like member 45 are disposed in parallel in the horizontal direction with the strut 12 being interposed therebetween. The chassis 5 is positioned in front of the strut 12. The section of the strut 12, of which the front side is opened, is formed in a U-shape. That is, the front side of the strut 12 is an opening portion, and a screw hole is not formed therein.

A first projected portion 44 that projects toward the inside with a part thereof being recessed from the outside is formed on the second plate-like member 43 that is positioned at one of both sides of the fixed strut 12. In addition, a second projected portion 46 that projects toward the inside with a part thereof being recessed from the outside is formed on the third plate-like member 45 that is positioned at the other one of both sides of the strut 12. A direction in which the first projected portion 44 and the second projected portion 46 project is a direction facing the fixed strut 12. The first projected portion 44 and the second projected portion 46 are formed continuously in the longitudinal direction. In addition, front-and-back direction positions of the first projected portion 44 and the second projected portion 46 are different from each other, and the second projected portion 46 is formed at a position nearer to the back compared to the first projected portion 44. The first projected portion 44 and the second projected portion 46 are formed, for example, by drawing. The first projected portion 44 and the second projected portion 46 may be formed discontinuously in the longitudinal direction, without being limited to being formed continuously in the longitudinal direction.

Grooves that are recessed from the outside are formed in side portions of the strut 12. Specifically, a first groove 14 is formed in a portion opposing the first projected portion 44, and a second groove 15 is formed in a portion opposing the second projected portion 46. The first groove 14 and the second groove 15 are formed continuously in the longitudinal direction from tip portions of the strut 12. The length of the first groove 14 in the front-and-back direction within the section of the strut 12 exceeds the length of the first projected portion 44 in the front-and-back direction within an inner surface of the second plate-like member 43. The length of the second groove 15 in the front-and-back direction exceeds the length of the second projected portion 46 in the front-and-back direction within an inner surface of the third plate-like member 45. The second groove 15 is formed at a position nearer to the back compared to the first groove 14. In addition, no groove is formed in back of the first groove 14 in a side portion where the first groove 14 of the strut 12 is formed, and no groove is formed in front of the second groove 15 in a side portion where the second groove 15 of the strut 12 is formed.

The strut 12 is inserted into the fixing portion 4 from below with the opening portion facing the front. The first groove 14 is formed at a position where the first groove 14 engages with the first projected portion 44 in a case where the strut 12 is inserted into the fixing portion 4 with the opening portion facing the front. Similarly, the second groove 15 is formed at a position where the second groove 15 engages with the second projected portion 46. By the first groove 14 being engaged with the first projected portion 44, and the second groove 15 being engaged with the second projected portion 46, the strut 12 is internally fitted to the fixing portion 4. By the strut 12 being internally fitted to the fixing portion 4, the position of the strut 12 is determined within the section orthogonal to the axial direction thereof. A screw is screwed in from the back of the first plate-like member 41, and the strut 12 is reliably fixed to the fixing portion 4.

As illustrated in FIG. 7, between the two fixing portions 4, the positions of the second plate-like member 43 and the third plate-like member 45 with respect to the fixed strut 12 are in reverse to each other in terms of right and left. That is, in one fixing portion 4, the second plate-like member 43 is present to the right of the strut 12, and the third plate-like member 45 is present to the left of the strut 12. On the other hand, in the other fixing portion 4, the second plate-like member 43 is present to the left of the strut 12 and the third plate-like member 45 is present to the right of the strut 12. For this reason, between the two fixing portions 4, the positions of the first projected portion 44 and the second projected portion 46 are also in reverse to each other in terms of right and left. In addition, in the two struts 12, the positions of the side portions, in which the first groove 14 and the second groove 15 are formed, are in reverse to each other in terms of right and left according to the shapes of the fixing portions 4. That is, the first groove 14 is present on the right side portion and the second groove 15 is present on the left side portion in one strut 12. On the other hand, the first groove 14 is present on the left side portion and the second groove 15 is present on the right side portion in the other strut 12.

In a case where a user attaches the two stands 1 at positions that are in reverse to each other in terms of right and left, the first groove 14 and the second groove 15 of the strut 12 are not at positions where the first groove 14 and the second groove 15 engage with the first projected portion 44 and the second projected portion 46 of the fixing portion 4. For this reason, the strut 12 interferes with the first projected portion 44 and the second projected portion 46, and is not inserted into the fixing portion 4. Since the strut 12 is not inserted, the strut 12 cannot be fixed. Accordingly, the user cannot attach the stand 1. In this way, the two stands 1 are prevented from being attached with the positions thereof reversed in terms of right and left.

In addition, in a case where the user intends to attach the stand 1 with the opening portion of the strut 12 brought into a state of facing the side, the strut 12 interferes with a first projected portion 44 or the second projected portion 46 and is not inserted into the fixing portion 4. In addition, in a case where the user intends to attach the stand 1 with the opening portion of the strut 12 brought into a state of facing the back, the screw cannot be screwed in from the back and thus the strut 12 cannot be fixed since the back portion of the strut 12 is opened. In this way, the stand 1 is prevented from being attached to the housing 2 with the opening portion of the strut 12 facing a direction other than the front. The positions of the first projected portion 44 and the second projected portion 46 may be determined such that the first groove 14 is not engaged with the second projected portion 46 and the second groove 15 is not engaged with the first projected portion 44 in a state where the opening portion of the strut 12 faces the back. In this case, in a state where the opening portion of the strut 12 faces the side, the strut 12 is not inserted into the fixing portion 4 and thus the stand 1 is prevented from being attached.

As described above, in the display device, the two stands 1 are prevented from being attached at reverse positions with respect to the right positions and the stands 1 are prevented from being attached to the housing 2 in the wrong orientation. Accordingly, the stand 1 attached to the housing 2 is capable of appropriately supporting the housing 2 and thus the falling of the display device is prevented.

As illustrated in FIG. 5 and FIG. 6, the fixing portion 4 is formed symmetrically in the longitudinal direction. That is, the shape of the fixing portion 4 is plane-symmetrical with respect to a plane that bisects the fixing portion 4 in the longitudinal direction. For example, the fixing portion 4 is provided with two through-holes 42, and a distance from one end thereof to one through-hole 42 is the same as a distance from the other end thereof to the other through-hole 42. The two fixing portions 4 are in the same shape, and are disposed with up and down reversed to each other. Accordingly, between the two fixing portions 4, the positions of the second plate-like member 43 and the third plate-like member 45 are in reverse to each other in terms of right and left. That is, the two fixing portions 4 are common components, and are in a shape where the two stands 1 can be prevented from being attached with right and left reversed. Since the two fixing portions 4 are common components, the manufacturing costs of the display device are restricted. Accordingly, the display device allows preventing two stands 1 from being attached with right and left reversed while restricting manufacturing costs.

The fixing portion 4 is not limited to a configuration in which the fixing portion 4 is in plane-symmetry. For example, the fixing portion 4 may be provided with three or more through-holes at asymmetrical positions, and any one of the through-holes may correspond to the screw hole 13. In addition, the first projected portion 44 and the second projected portion 46 may not be plane-symmetrical as well. Even if the first projected portion 44 and the second projected portion 46 are not plane-symmetrical, the strut 12 can be inserted into each of the two fixing portions 4 that are disposed with up and down reversed to each other insofar as the first projected portion 44 and the second projected portion 46 extend in the longitudinal direction of the fixing portion 4. In addition, the penetration portion formed in the first plate-like member 41 is not limited to the through-hole. For example, the fixing portion 4 may be in a form where a through-groove through which the screw can penetrate is formed in the first plate-like member 41.

<Second Embodiment>

Figure 8:
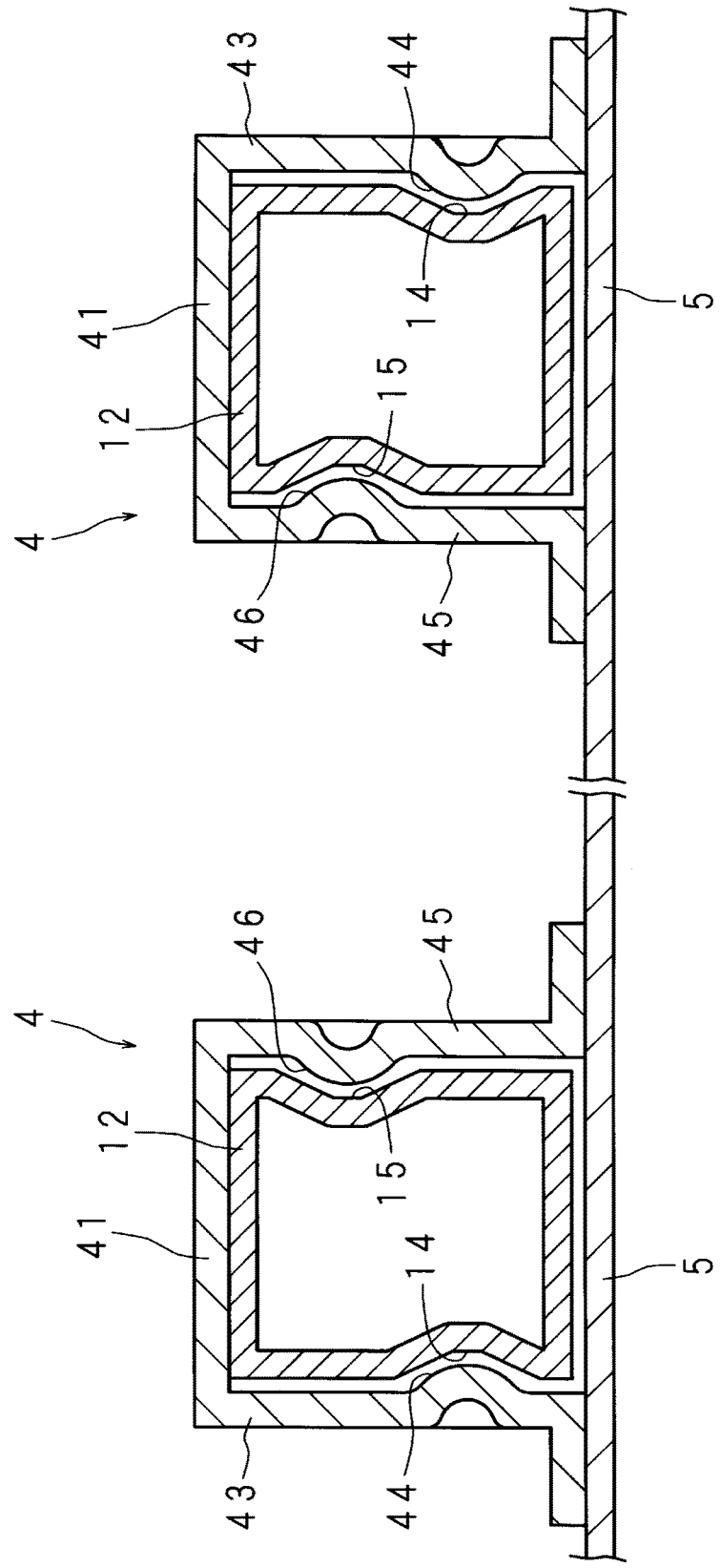
FIG. 8 is a sectional view of fixing portions and struts according to a second embodiment.

FIG. 8 is a sectional view of the fixing portions 4 and the struts 12 according to a second embodiment. FIG. 8 illustrates a state where the strut 12 is fixed to the fixing portion 4, and also illustrates a section of the strut 12, which is orthogonal to the axial direction thereof. In first embodiment, a form in which the front side of the strut 12 is the opening portion has been described. In the second embodiment, however, the strut 12 does not have an opening portion. In this embodiment, the strut 12 is a rectangular tube, and the first groove 14 and the second groove 15 are formed in the strut 12. In the two struts 12, the positions of the side portions, in which the first groove 14 and the second groove 15 are formed, are in reverse to each other in terms of right and left. In addition, it is desirable that a screw hole be not formed in the front side of the strut 12. The configuration of each unit of the display device, except for the strut 12, is the same as that of the first embodiment.

In this embodiment as well, the two stands 1 are prevented from being attached with right and left reversed. In addition, by a screw hole not being formed in the front side of the strut 12, the strut 12 cannot be fixed in a case where the user intends to attach the stand 1 with the front and back of the strut 12 reversed. In this way, the stand 1 is prevented from being attached to the housing 2 in the wrong orientation. Accordingly, in this embodiment as well, the display device allows preventing the two stands 1 from being attached with right and left reversed while restricting manufacturing costs.

<Third Embodiment>

Figure 9:
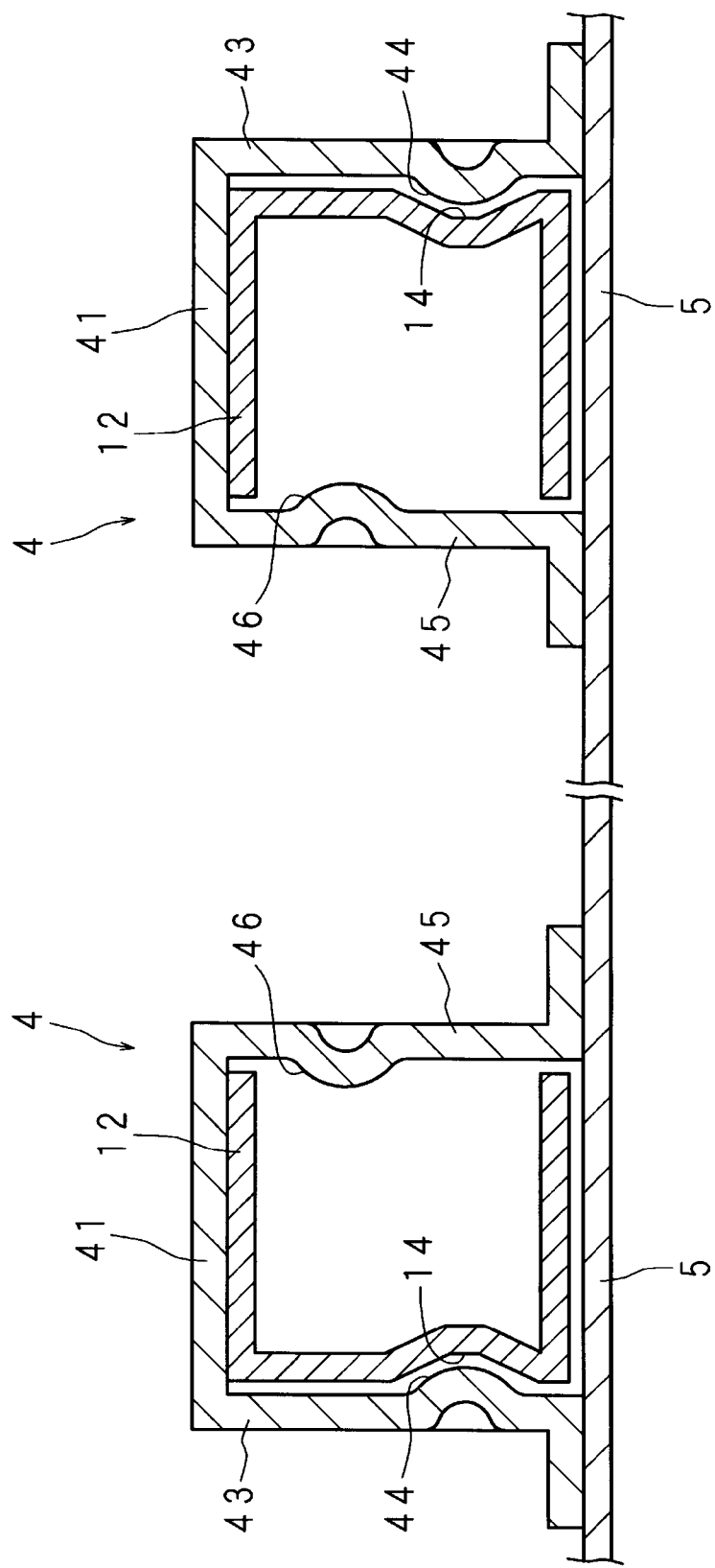
FIG. 9 is a sectional view of fixing portions and struts according to a third embodiment.

FIG. 9 is a sectional view of the fixing portions 4 and the struts 12 according to a third embodiment. FIG. 9 illustrates a state where the strut 12 is fixed to the fixing portion 4, and also illustrates a section of the strut 12, which is orthogonal to the axial direction thereof. In the first embodiment, a form in which the front side of the strut 12 is the opening portion has been described. In the third embodiment, however, the front side of the strut 12 is not the opening portion, and one of both side portions of the strut 12 is the opening portion. The first groove 14 is formed in the other one of both side portions of the strut 12. By the first groove 14 being engaged with the first projected portion 44 and the opening portion being opposed to the second projected portion 46, the strut 12 is internally fitted to the fixing portion 4. In the two struts 12, the positions of the side portion which is the opening portion and the side portion in which the first groove 14 is formed are in reverse to each other in terms of right and left. In a case where the user intends to attach the two stands 1 at positions where right and left are reversed, the strut 12 interferes with the second projected portion 46 and is not inserted into the fixing portion 4. In addition, it is desirable that a screw hole be not formed in the front side of the strut 12. The configuration of each unit of the display device, except for the strut 12, is the same as that of the first embodiment.

In this embodiment as well, the two stands 1 are prevented from being attached with right and left reversed. In addition, by the screw hole not being formed in the front side of the strut 12, the strut 12 cannot be fixed in a case where the user intends to attach the stand 1 with the front and back of the strut 12 reversed. In this way, the stand 1 is prevented from being attached to the housing 2 in the wrong orientation. Accordingly, in this embodiment as well, the display device allows preventing the two stands 1 from being attached with right and left reversed while restricting manufacturing costs. One of both side portions of the strut 12 may be the opening portion, and the second groove 15 may be formed in the other one of both side portions of the strut 12.

In the first to third embodiments described above, a form in which the display device is provided with the fixing portion 4 of which the section is in a U-shape has been described. However, the display device may be in a form where the display device is provided with the fixing portion 4 formed into a rectangular tube. In addition, a form in which the first projected portion 44 and the second projected portion 46 of the fixing portion 4 are formed by drawing has been described. However, the fixing portion 4 may be in a form where a depression, which is entailed by the first projected portion 44 and the second projected portion 46, is not formed in the outer surfaces of the second plate-like member 43 and the third plate-like member 45. In addition, the strut 12 may be a cylinder without being limited to a prism.

As described above, the display device according to an aspect of the present disclosure includes the display unit (2) which displays an image on the front side, the holder (5) which is disposed in back of the display unit (2) and holds the display unit (2), the two stands (1), each of which has the strut (12), and the two fixing portions (4) which are attached to the back portion of the holder (5) and are for fixing the struts (12) to the holder (5) by enclosing the back side and both horizontal sides of each of the struts (12). In the display device, each of the two fixing portions (4) has the first plate-like member (41) which is positioned in back of the fixed strut (12), the second plate-like member (43) which is positioned at one of both sides of the strut (12) and in which the first projected portion (44) projecting toward the strut (12) is formed in the axial direction of the strut (12), and the third plate-like member (45) which is positioned at the other one of both sides of the strut (12) and in which the second projected portion (46) projecting toward the strut (12) is formed in the axial direction of the strut (12) at the position nearer to the back compared to the first projected portion (44). In addition, between the two fixing portions (4), the positions of the second plate-like member (43) and the third plate-like member (45) with respect to the strut (12) are in reverse to each other.

In the display device according to an aspect of the present disclosure, the first groove (14) that engages with the first projected portion (44) is formed in the axial direction only in one of both side portions of the strut (12) and the second groove (15) that engages with the second projected portion (46) is formed in the axial direction only in the other one of both side portions of the strut (12). In addition, between the two stands (1), the positions of side portions of the strut (12) in which the first groove (14) and the second groove (15) are formed, are in reverse to each other.

In the display device according to an aspect of the present disclosure, the penetration portion (42) through which the screw for fixing the strut (12) penetrates is formed in the first plate-like member (41), the screw hole (13) in which the screw is screwed is formed in the back side of the strut (12), and a screw hole is not formed in the front side of the strut (12).

The television receiver according to an aspect of the present disclosure includes the display device according to an aspect of the present disclosure and the reception unit that receives a television broadcast, in which the display device displays a motion picture based on the television broadcast received with the reception unit.

In the present disclosure, the display device, also used as the television receiver, includes the display unit (3), the holder (5) that holds the display unit (3), the two stands (1) that have the strut (12), and the fixing portion (4) for fixing the strut (12). The fixing portion (4) has the first plate-like member (41) that is positioned in back of the fixed strut (12) and the second plate-like member (43) and the third plate-like member (45) that are positioned at both sides of the strut (12). The first projected portion (44) that projects toward the strut (12) is formed on the second plate-like member (43), and the second projected portion (46) that projects at the position nearer to the back compared to the first projected portion (44) is formed on the third plate-like member (45). Between the two fixing portions (4), the positions of the second plate-like member (43) and the third plate-like member (45) are in reverse to each other. In a case where the two stands (1) are intended to be attached with right and left reversed, the two stands (1) cannot be attached due to the shape of the strut (12) since the shape of the strut (12) does not match the shape of the first projected portion (44) and the second projected portion (46) of the fixing portion (4). In addition, once the orientation of one fixing portion (4) is reversed in the axial direction of the strut (12), the shape of the fixing portion (4) becomes the same as the other fixing portion (4), and thus the two fixing portions (4) are common components.

In addition, in the present disclosure, the first groove (14) that engages with the first projected portion (44) is formed only in one side portion of the strut (12), and the second groove (15) that engages with the second projected portion (46) is formed only in the other side portion. Between the two stands (1), the positions of the side portion in which the first groove (14) is formed and the side portion in which the second groove (15) is formed are in reverse to each other. In a case where the two stands (1) are intended to be attached with right and left reversed, the stands (1) cannot be attached since the first groove (14) and the second groove (15) of the strut (12) do not engage with the first projected portion (44) and the second projected portion (46) of the fixing portion (4).

In addition, in the present disclosure, the screw hole (13) is formed in the back side of the strut (12), and no screw hole is present in the front side. The strut (12) is fixed by the screw being screwed from the back. In a case where the stand (1) is intended to be attached with front and back reversed, the stand (1) cannot be attached since the strut (12) cannot be screwed from the back.

<Fourth Embodiment>

Figure 10:
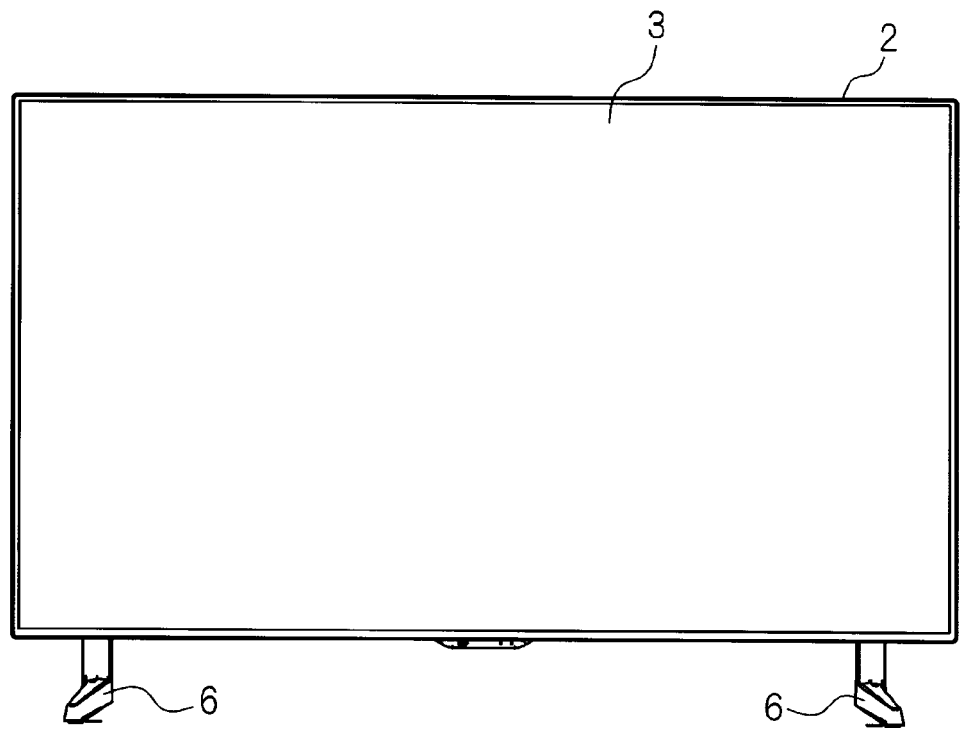
FIG. 10 is a schematic front view of a display device according to a fourth embodiment.

FIG. 10 is a schematic front view of a display device according to a fourth embodiment. The display device is configured as a thin display device of which a length in the front-and-back direction is significantly smaller than a length in a direction orthogonal to the front-and-back direction. The display device is provided with the display unit 3, including a display panel such as a liquid crystal display and an EL panel, and the display unit 3 displays a motion picture on the front surface using the display panel. The display unit 3 is accommodated in the housing 2. The housing 2 is in a thin rectangular parallelepiped shape. The display device is further provided with two stands 6 that support the housing 2 from the lower side. The display device is further provided with other components (not illustrated), including a reception unit, an input and output interface, a motion picture processing unit, a speaker, and a power supply, and is configured as the television receiver according to the present disclosure. The reception unit (not illustrated) receives a television broadcast, and the display unit 3 displays the motion picture based on the television broadcast received with the reception unit. The television receiver according to the present disclosure may be in a form provided with a reception unit separated from the display device. In addition, the display device according to the embodiment may be a display device other than the television receiver.

Figure 11:
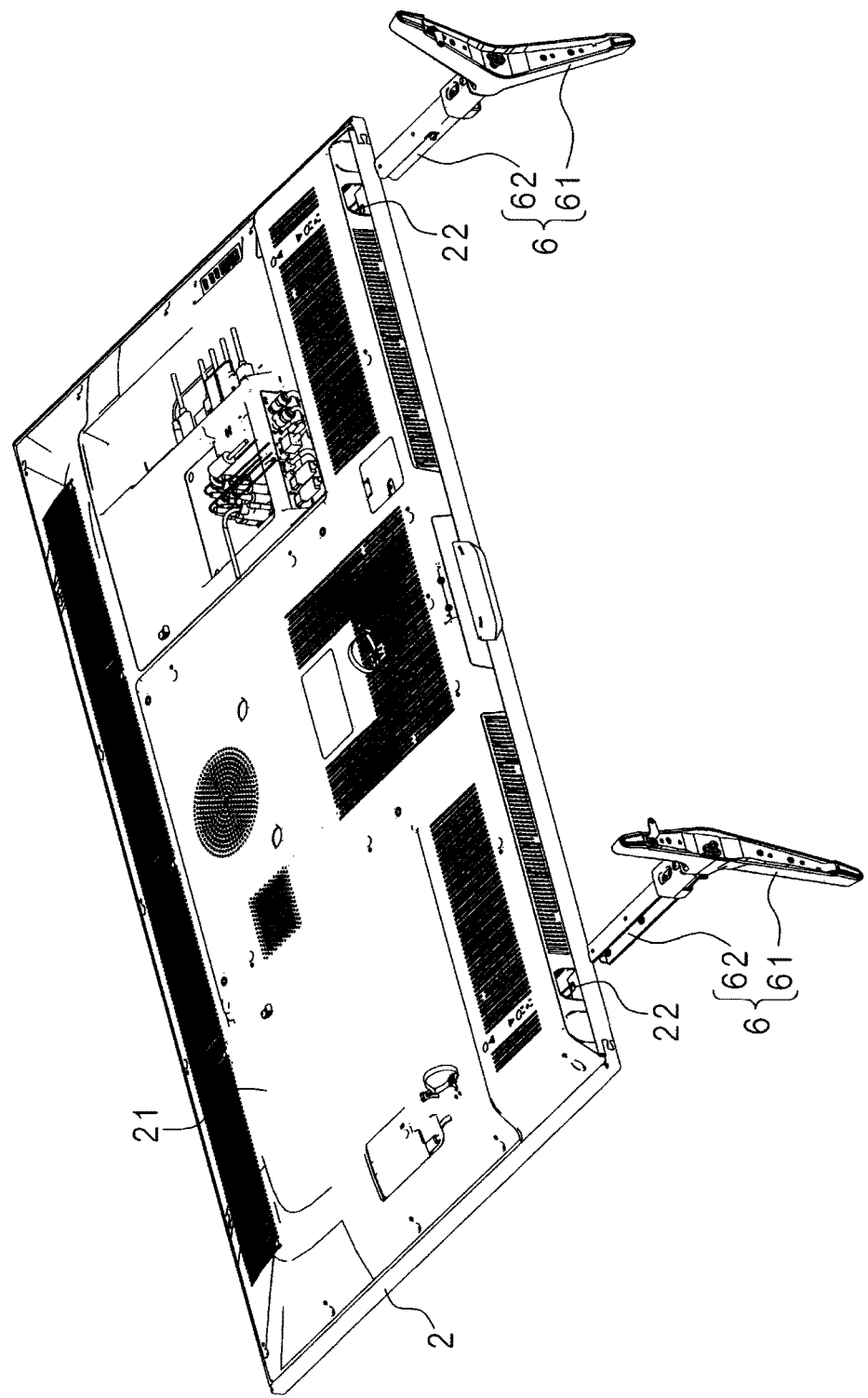
FIG. 11 is a schematic perspective view of a back side of the display device according to the fourth embodiment.

FIG. 11 is a schematic perspective view illustrating a back side of the display device according to the fourth embodiment. FIG. 11 illustrates a state where the stand 6 is yet to be attached to the housing 2. The housing 2 includes the rear cabinet 21 that configures the back surface of the display device. The stand 6 has a leg portion 61 that is in contact with a mounting surface including a floor, and a strut portion 62 that is fixed to the leg portion 61 and is attached within the housing 2. In a state where the leg portion 61 is contact with the mounting surface, the strut portion 62 is substantially perpendicular to the mounting surface. Two insertion-holes 22 into which the two strut portions 62 are inserted are formed in the lower surface of the housing 2. The strut portion 62 is fixed to the housing 2 by the strut portion 62 being inserted into each insertion-hole 22, and being screwed from the back side of the rear cabinet 21.

Figure 12:
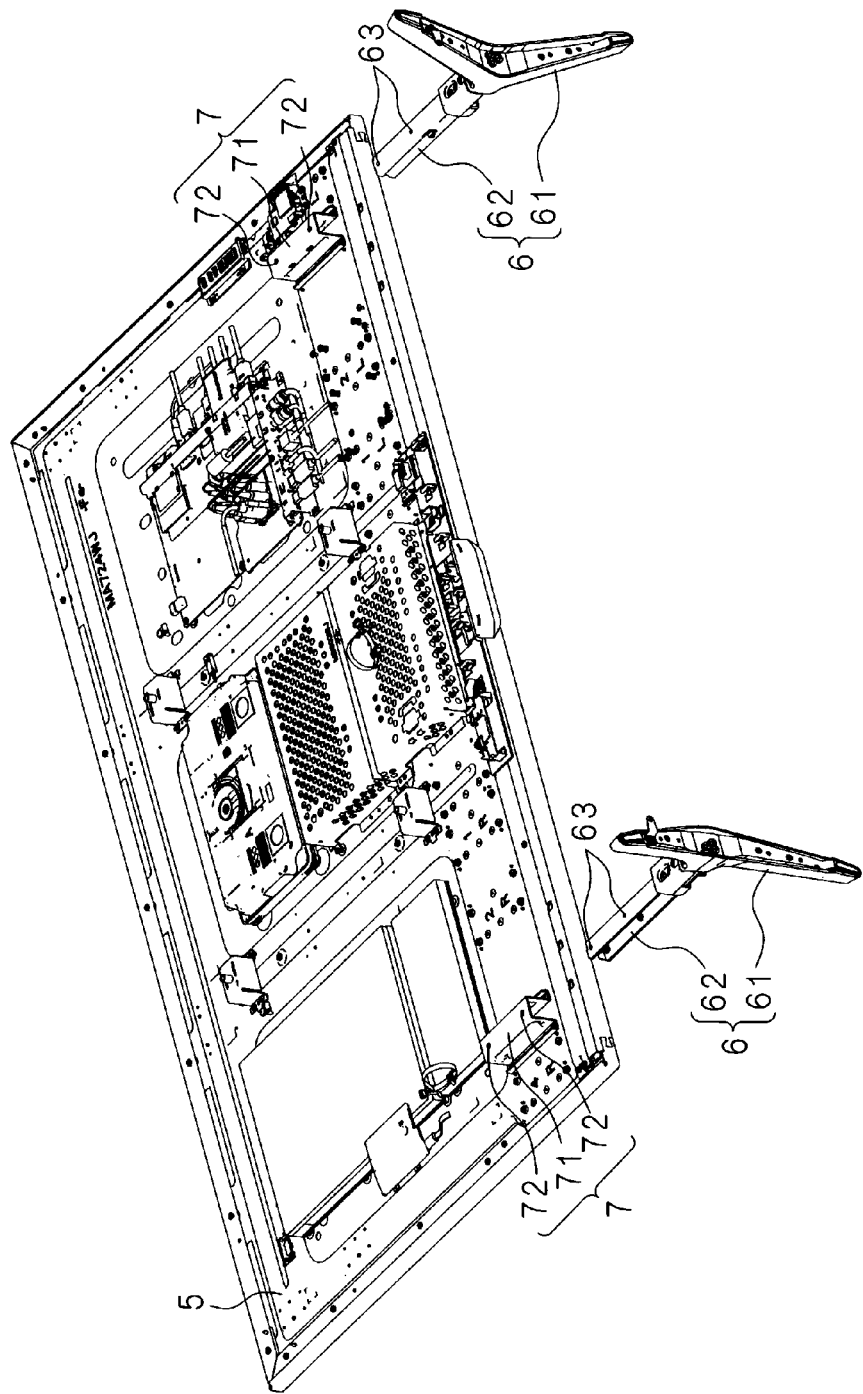
FIG. 12 is a schematic perspective view illustrating the back side of the display device from which a rear cabinet is removed according to the fourth embodiment.
Figure 13:
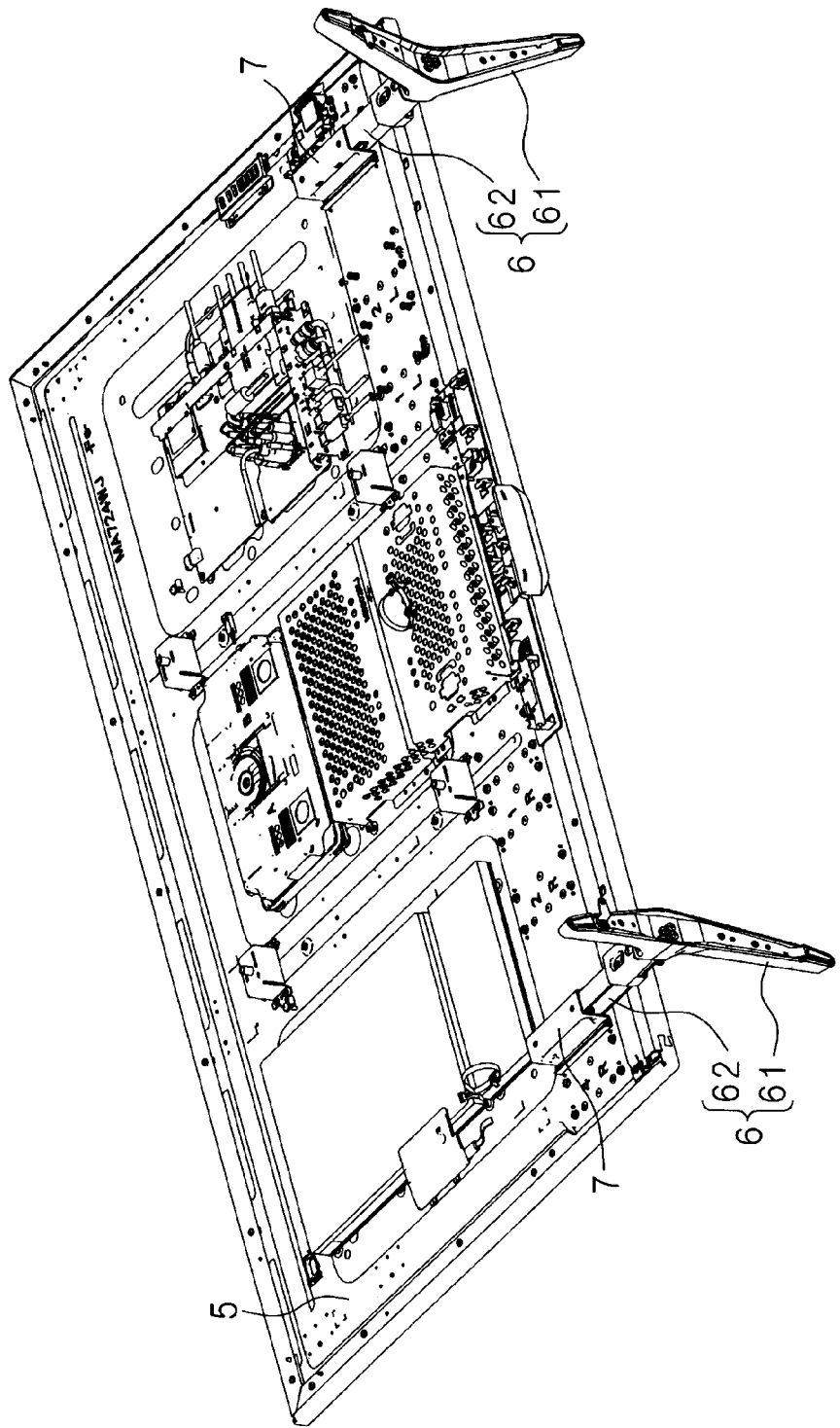
FIG. 13 is a schematic perspective view illustrating the back side of the display device from which the rear cabinet is removed according to the fourth embodiment.

FIG. 12 and FIG. 13 are schematic perspective views illustrating the back side of the display device, from which the rear cabinet 21 is removed, according to the fourth embodiment. FIG. 12 illustrates a state where the stand 6 is yet to be attached to the housing 2, and FIG. 13 illustrates the back side of the display device from which the rear cabinet 21 is removed in a state where the stand 6 is attached. In reality, the stand 6 is attached to the housing 2 in a state where the rear cabinet 21 is present. The chassis (holder) 5 that holds the display unit 3 is provided within the housing 2. The chassis 5 is formed substantially in a plate shape and holds the display unit 3 from the back side. An attaching portion 7 for attaching the strut portion 62 is provided on the back side of the chassis 5. The attaching portion 7 is a long member, and a section thereof, which is orthogonal to the longitudinal direction, is formed in a U-shape. The attaching portion 7 is attached to the back surface of the chassis 5 such that a U-shaped opening side faces the front. The position of the attaching portion 7 in the horizontal direction corresponds to the position of the insertion-hole 22. The strut portion 62 is inserted into the housing 2 from the insertion-hole 22 by being inserted into a rectangular-tube-like portion formed of the attaching portion 7 and the back surface of the chassis 5. The back side and both horizontal sides of the inserted strut portion 62 are enclosed with the attaching portion 7, and the front side of the strut portion 62 is enclosed with the chassis 5. The two attaching portions 7 are disposed in parallel with the longitudinal direction thereof being in the up-and-down direction such that the two strut portions 62 are inserted in parallel. The attaching portion 7 has a plate-like back side member 71 that covers the back side of the strut portion 62, and a through-hole 72 is formed in the back side member 71. In addition, a screw hole 63 is formed in the strut portion 62. The strut portion 62 is fixed to the attaching portion 7 by a screw being screwed in from the back side of the rear cabinet 21 and the screw being screwed with the screw hole 63 in a state where the strut portion 62 is inserted into the attaching portion 7. In this way, the strut portion 62 is attached to the chassis 5. In a state where the strut portion 62 is attached to the chassis 5, the stand 6 supports the chassis 5 from the lower side.

Figure 14:
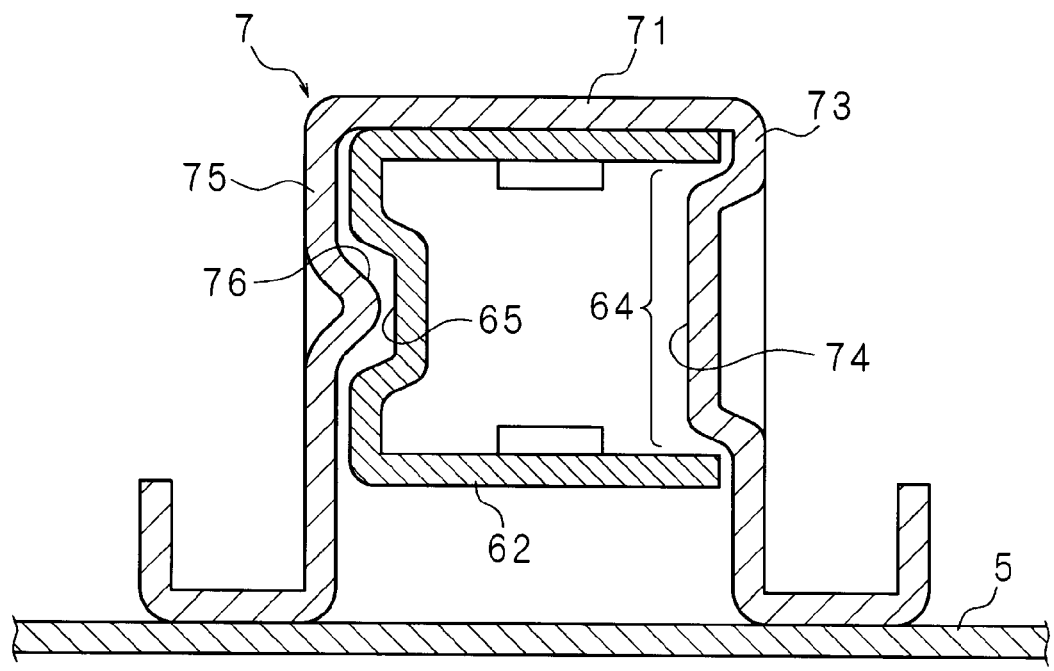
FIG. 14 is a sectional view of an attaching portion and a strut portion.

FIG. 14 is a sectional view of the attaching portion 7 and the strut portion 62. FIG. 14 illustrates a state where the strut portion 62 is inserted into and fixed to the attaching portion 7. In addition, FIG. 14 illustrates a section of the attaching portion 7 and the strut portion 62, which is orthogonal to the longitudinal direction. The lower side of FIG. 14 corresponds to the front side of the display device, and the upper side of FIG. 14 corresponds to the back side of the display device. As described above, the section of the attaching portion 7, of which the front side is opened, is formed in a U-shape. The attaching portion 7 has the plate-like back side member 71 positioned in back of the attached strut portion 62, and a plate-like first side member 73 and second side member 75 that are positioned at both horizontal sides of the strut portion 62. The chassis 5 is positioned in front of the strut portion 62. The section of the strut portion 62 is formed in a U-shape having an opening portion 64. The opening portion 64 is opened in the longitudinal direction of the strut portion 62.

A third projected portion 74 that projects toward the inside with a part thereof being recessed from the outside is formed on the first side member 73 positioned at one of both horizontal sides of the attached strut portion 62. In addition, a fourth projected portion 76 that projects toward the inside with a part thereof being recessed from the outside is formed on the second side member 75 positioned at the other one of both horizontal sides of the strut portion 62. By the third projected portion 74 and the fourth projected portion 76 being formed, a part of the outer surfaces of the first side member 73 and the second side member 75 is recessed and is shaped into a groove, and a part of the inner surfaces projects toward the inside. The third projected portion 74 and the fourth projected portion 76 are formed in the longitudinal direction. As illustrated in FIG. 14, the third projected portion 74 and the fourth projected portion 76 are formed on both horizontal sides of the attached strut portion 62, and the third projected portion 74 opposes the fourth projected portion 76. The fourth projected portion 76 has a smaller length in the front-and-back direction than the third projected portion 74. The third projected portion 74 and the fourth projected portion 76 are formed, for example, by drawing.

The distance by which the opening portion 64 is opened within the section of the strut portion 62 exceeds the length of the third projected portion 74 in the front-and-back direction within the inner surface of the first side member 73. The length of the strut portion 62 in the horizontal direction within the section exceeds a distance between the opposing third projected portion 74 and the fourth projected portion 76, and falls short of a distance between inner surfaces on which the third projected portion 74 and the fourth projected portion 76 are not formed within the both walls of the first side member 73 and the second side member 75. In addition, the length of the strut portion 62 in the front-and-back direction within the section exceeds the distance between the opposing third projected portion 74 and fourth projected portion 76. In addition, a recessed portion 65 that is recessed from the outside is formed at a position on a side opposite to the opening portion 64 of the strut portion 62. The recessed portion 65 is continuously formed in the longitudinal direction from the tip portion of the strut portion 62. The length of the recessed portion 65 in the front-and-back direction within the section of the strut portion 62 falls short of the length of the third projected portion 74 in the front-and-back direction within the inner surface of the first side member 73, and exceeds the length of the fourth projected portion 76 in the front-and-back direction within the inner surface of the second side member 75.

As illustrated in FIG. 14, the strut portion 62 is inserted into the attaching portion 7 with the opening portion 64 facing the first side member 73. The third projected portion 74 is interposed in the opening portion 64 in the front-and-back direction on the inside of the attaching portion 7. In a case where the strut portion 62 is inserted into the attaching portion 7 such that the third projected portion 74 is interposed in the opening portion 64, the recessed portion 65 is formed at a position where the recessed portion 65 engages with the fourth projected portion 76. That is, the recessed portion 65 engages with the fourth projected portion 76 that projects toward the inside of the second side member 75 since the recessed portion 65 is recessed from the outside. The strut portion 62 is internally fitted to the attaching portion 7 by the third projected portion 74 being interposed in the opening portion 64 and the recessed portion 65 being engaged with the fourth projected portion 76. By the strut portion 62 being internally fitted to the attaching portion 7, the position of the strut portion 62 is determined within the section orthogonal to the longitudinal direction and the strut portion 62 is reliably fixed to the attaching portion 7. Since the position of the strut portion 62 is determined by the third projected portion 74 and the fourth projected portion 76, a clearance between the attaching portion 7 and the strut portion 62 can be adjusted only by the shapes of the attaching portion 7 and the strut portion 62. When the clearance is adjusted with an aim of restricting the rattling of the stand 6, adjustment can be carried out without having an effect on components other than the attaching portion 7 and the strut portion 62.

In a case where the strut portion 62 is intended to be inserted into the attaching portion 7 with the recessed portion 65 facing the third projected portion 74, the strut portion 62 cannot be inserted into the attaching portion 7 due to interference of the attaching portion 7 since the length of the recessed portion 65 in the front-and-back direction is smaller than that of the third projected portion 74. In addition, in a case where the strut portion 62 is intended to be inserted into the attaching portion 7 with the opening portion 64 facing the front or the back, the strut portion 62 cannot be inserted into the attaching portion 7 due to the interference of the third projected portion 74 with the strut portion 62 and the fourth projected portion 76 since the length of the strut portion 62 in the right-and-left direction exceeds the distance between the third projected portion 74 and the fourth projected portion 76. Accordingly, the strut portion 62 can be inserted into the attaching portion 7 with the opening portion 64 facing only the third projected portion 74, and is not inserted into the attaching portion 7 with the opening portion 64 facing other directions. For this reason, the stand 6 is prevented from being attached in the wrong orientation.

By the third projected portion 74 and the fourth projected portion 76 being formed on the attaching portion 7, the third projected portion 74 and the fourth projected portion 76 work as ribs that reinforce the attaching portion 7. For this reason, the strength of the attaching portion 7 is improved compared to a state where the third projected portion 74 and the fourth projected portion 76 are not formed. Since the strut portion 62 is fixed to the attaching portion 7 of which strength is improved, the rigidity of the entire display device, in which the stand 6 supports the housing 2, is secured. In addition, the two attaching portions 7 are configured such that positions of both sides of the first side member 73 and the second side member 75, with respect to the attached strut portion 62 are in reverse to each other. Specifically, both of the two attaching portions 7 are configured such that the first side member 73 is positioned on a side adjacent to an end of the chassis 5, and the second side member 75 is positioned on a side adjacent to the middle of the chassis 5. Consequently, as illustrated in FIG. 12 and FIG. 13, the two stands 6 are configured such that the positions of the opening portion 64 and the recessed portion 65 of the strut portion 62 are in reverse to each other. Specifically, both of the two strut portions 62 are configured such that the opening portion 64 is positioned on the side adjacent to the end of the chassis 5, and the recessed portion 65 is positioned on the side adjacent to the middle of the chassis 5. In such a configuration, the structure of the two attaching portions 7 and the structure of the two strut portions 62 are bilaterally symmetrical about the middle of the chassis 5. Accordingly, external force exerted to the two attaching portions 7 and the two strut portions 62 is bilaterally symmetrical, and thus the two stands 6 can support the chassis 5 in good balance. The two attaching portions 7 may be configured such that the first side member 73 is positioned on the side adjacent to the middle of the chassis 5, and the fourth projected portion 76 is positioned on the side adjacent to the end of the chassis 5. The two strut portions 62 may be configured such that the opening portion 64 is positioned on the side adjacent to the middle of the chassis 5, and the recessed portion 65 is positioned on the side adjacent to the end of the chassis 5.

Figure 15A:
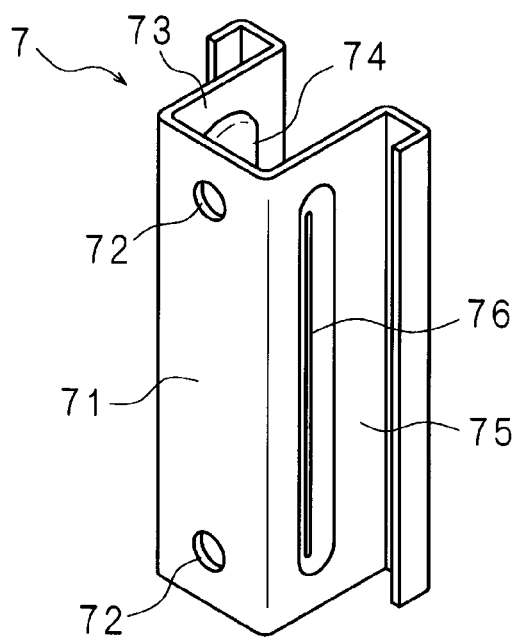
FIG. 15A is a schematic perspective view illustrating the attaching portion according to the fourth embodiment.
Figure 15B:
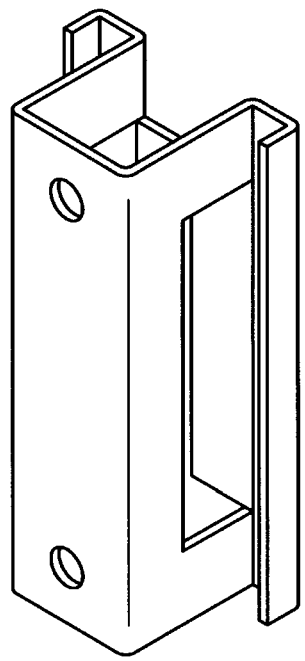
FIG. 15B is a schematic perspective view illustrating the attaching portion which is the comparison target.

In order to verify the rigidity of the display device according to the embodiment, the display device according to the embodiment was compared to a display device provided with an attaching portion having a different shape. It was assumed that a part of the attaching portion should be cut out and bent in order to secure the strength of the attaching portion. Structural analysis was conducted on the display device according to the embodiment and the display device provided with the attaching portion with a cut-out, and the rigidity of each of the devices was compared. FIG. 15A and FIG. 15B are schematic perspective views illustrating the attaching portion 7 according to the fourth embodiment and an attaching portion, which is a comparison target. FIG. 15A illustrates the attaching portion 7, and FIG. 15B illustrates the attaching portion, which is the comparison target. In the attaching portion which is the comparison target illustrated in FIG. 15B, the third projected portion 74 and the fourth projected portion 76 are not formed, a slit is made in the longitudinal direction in two plate-like side members of which inner surfaces oppose each other, and a part of the side member is bent toward the inside. The bent portion intersects a surface of the side member, and plays a role of improving the strength of the attaching portion.

Figures 16, 17:
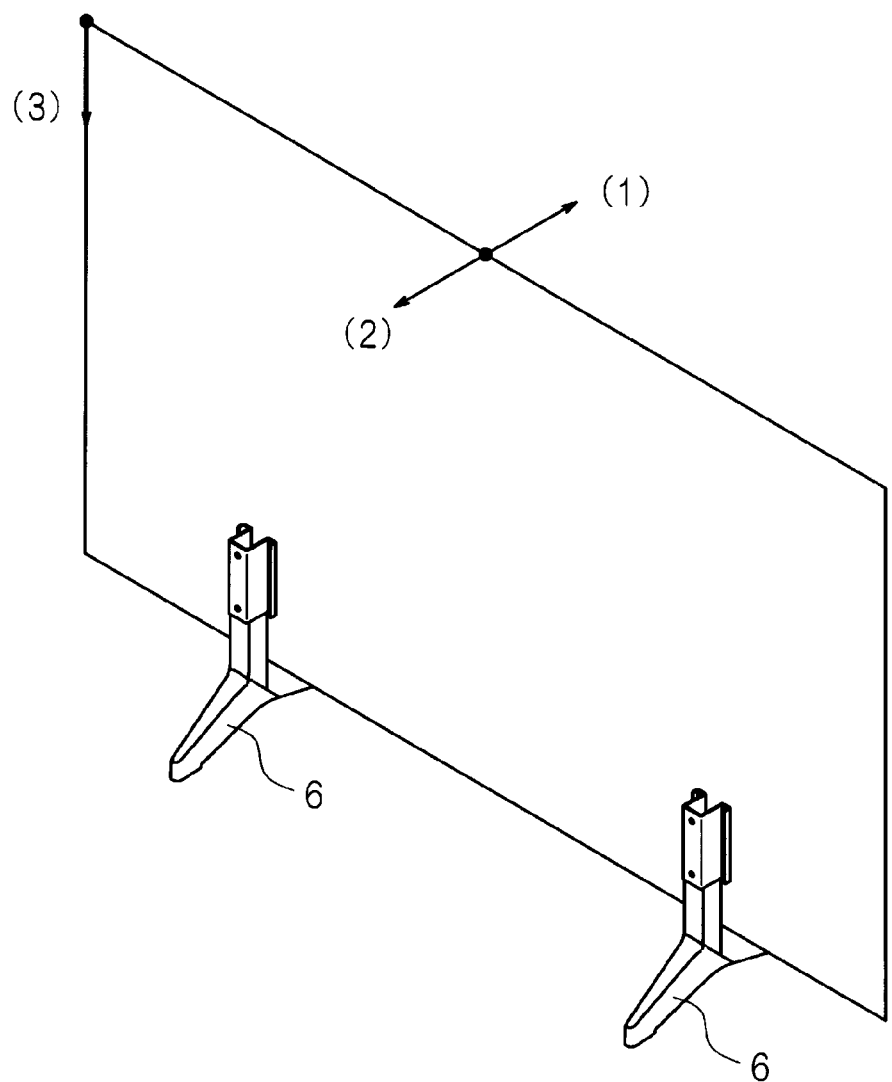
FIG. 16 is an explanatory view illustrating conditions for structural analysis.
FIG. 17 is a table showing structural analysis results.

FIG. 16 is an explanatory view illustrating conditions for structural analysis. FIG. 16 is a schematic perspective view of the display device from which the rear cabinet 21 is removed. In the structural analysis, external force of a predetermined strength was applied in a predetermined direction onto a predetermined point of the display device which is provided with two attaching portions and in which the housing 2 is supported by the two stand 6, and then the magnitude of displacement of a portion to which the external force was applied was simulated. The structures of the display device according to the embodiment and the display device, which is the comparison target, are the same except for the attaching portion. The structural analysis was conducted for three conditions having different external force. A first condition is applying forward external force of 100N onto the middle of the upper surface of the display device, and the external force is indicated by (1) in FIG. 16. A second condition is applying backward external force of 100N onto the middle of the upper surface of the display device, and the external force is indicated by (2) in FIG. 16. A third condition is applying downward external force of 100N onto an end of the upper surface of the display device, and the external force is indicated by (3) in FIG. 16. Structural analysis was conducted under each of the conditions, and the magnitude of displacement of a portion of the display device to which external force was applied was calculated.

FIG. 17 is a table showing structural analysis results. For the display device according to the embodiment and the display device which is the comparison target provided with the attaching portion having the cut-out illustrated in FIG. 15B, the maximum magnitudes of displacement of the portion to which external force was applied in accordance with each of the conditions are shown by the unit of mm. Under the first condition indicated by (1) and the second condition indicated by (2) in FIG. 17, the maximum magnitudes of displacement of both of the display devices were 20 mm, and no difference was found. Under the third condition indicated by (3) in FIG. 17, the maximum magnitude of displacement of the display device according to the embodiment was 11 mm, and the maximum magnitude of displacement of the display device, which is the comparison target, was 13 mm. The magnitude of displacement of the display device according to the embodiment was smaller. Under the third condition, force to rotate the attaching portion about an axis in the front-and-back direction was applied to the attaching portion. The attaching portion of the comparison target is required to withstand force by means of portions of the side members, excluding the portion that is cut out and bent. On the other hand, the attaching portion 7 according to the embodiment may withstand force with the entire first side member 73 and second side member 75. Since the force exerted to the attaching portion 7 was better distributed in the display device according to the embodiment compared to the comparison target, it is estimated that the magnitude of displacement was turned out to be smaller. According to the structural analysis results, it is evident that the display device provided with the attaching portion 7 having the third projected portion 74 and the fourth projected portion 76 has higher rigidity compared to the display device provided with the attaching portion of which a part is cut out and bent.

<Fifth Embodiment>

In this embodiment, the attaching portion 7 is formed symmetrically in the longitudinal direction. That is, the shape of the attaching portion 7 is plane-symmetrical with respect to a plane that bisects the attaching portion 7 in the longitudinal direction. For example, the attaching portion 7 is provided with the two through-holes 72, and a distance from one end to one through-hole 72 is the same as a distance from the other end to the other through-hole 72. In this embodiment, the two attaching portions 7 are attached to the chassis 5 in reverse to each other in terms of up and down. Since the two attaching portion 7, which are symmetrical in the longitudinal direction, are attached in reverse to each other in terms of up and down, the positions of the first side member 73 and the second side member 75 of the two attaching portions 7 are in reverse to each other, as in the fourth embodiment. Accordingly, the two attaching portions 7 are common components.

In addition, the strut portion 62 is formed symmetrically in the front-and-back direction when attached to the attaching portion 7. That is, the shape of the strut portion 62 is plane-symmetrical with respect to a plane that bisects the opening portion 64 in the longitudinal direction as in the shape illustrated in FIG. 14. For this reason, one strut portion 62 that can be attached to one attaching portion 7 and the other strut portion 62 having the same shape can be attached to the other attaching portion 7 with front and back reversed. Accordingly, the strut portions 62 of the two stands 6 are common components. Other configurations of the display device are similar to those of the fourth embodiment.

As described above, in this embodiment, the two attaching portions 7 are configured as common components, and the two strut portions 62 are configured as common components as well. Accordingly, the manufacturing costs of the display device are restricted.

<Sixth Embodiment>

Figure 18:
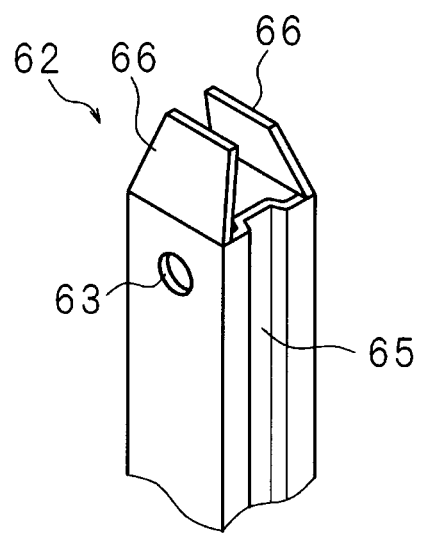
FIG. 18 is a schematic perspective view illustrating tip portions of a strut portion according to a sixth embodiment.

FIG. 18 is a schematic perspective view illustrating tip portions of the strut portion 62 according to a sixth embodiment. In this embodiment, two extended portions 66, which are parts of tips of the strut portion extended and tilted toward the center, are provided in the strut portion 62. The extended portion 66 is a portion obtained by a part of the strut portion 62 other than the opening portion 64 and the recessed portion 65 being extended. By the two extended portions 66 being tilted toward the center, the tips of the strut portion 62 are tapered. By the tips of the strut portion 62 being tapered, a work of inserting the strut portion 62 into the attaching portion 7 becomes easier. In addition, as in the attaching portion 7 illustrated in FIG. 15A, the third projected portion 74 and the fourth projected portion 76 of the attaching portion 7 are not formed on the ends of the first side member 73 and the second side member 75. Instead, the third projected portion 74 and the fourth projected portion 76 are formed on portions separated away from both ends of the first side member 73 and the second side member 75 to a certain degree. For this reason, in the attaching portion 7, the inside of both end portions are wider compared to the portions on which the third projected portion 74 and the fourth projected portion 76 are formed. By both end portions of the attaching portion 7 being wider, the work of inserting the strut portion 62 into the ends of the attaching portion 7 becomes easier. Other configurations of the display device are similar to those of the fourth embodiment. Accordingly, in this embodiment, a work of attaching the stand 6 to the housing 2 becomes easier, and thus a burden on a worker reduces. The configuration of the display device according to the sixth embodiment can be employed in combination with the configuration of the display device according to the fifth embodiment.

In the fourth to sixth embodiments described above, a form in which the attaching portion 7 of which the shape of the section is a U-shape has been described. However, the display device according to the present disclosure may be in a form where an attaching portion formed into a rectangular tube is provided therein. In addition, in the fourth to sixth embodiments, a form in which the third projected portion 74 and the fourth projected portion 76 of the attaching portion 7 are formed by drawing has been described. However, the attaching portion 7 may be in a form where depressions entailed by the third projected portion 74 and the fourth projected portion 76 are not formed in the outer surfaces of the first side member 73 and the second side member 75. In addition, in the fourth to sixth embodiments, a form in which the two stands 6 support the chassis 5 has been described. However, the display device according to the present disclosure may be in a form where one stand 6 or three or more stands 6 support the chassis 5. In addition, in the fourth to sixth embodiments, a form in which one stand 6 has one strut portion 62 has been described. However, the display device according to the present disclosure may be in a form where a stand, which has one leg portion and a plurality of strut portions, is provided therein. In addition, the stand may be in a form where the stand hangs down from up to support the housing 2.

As described above, the display device according to an aspect of the present disclosure includes the display unit (3) that displays a motion picture on the front side, the holder (5) that holds the display unit (3), the stand (6) which has the strut portion (62) attached along the back portion of the holder (5) and supports the holder (5), and the attaching portion (7) for enclosing the back side and both horizontal sides of the strut portion (62) and for attaching the strut portion (62) to the holder (5). In the display device, the attaching portion (7) has the plate-like back side member (71) positioned in back of the attached strut portion (62), the plate-like first side member (73) which is positioned at one of both horizontal sides of the strut portion (62) and in which the third projected portion (74), a part of the first side member (73) projecting toward the inside, is formed in the longitudinal direction of the strut portion (62), and the plate-like second side member (75) which is positioned at the other one of both horizontal sides of the strut portion (62) and in which the fourth projected portion (76), a part of the second side member (75) projecting toward the inside, is formed in the longitudinal direction of the strut portion (62) so as to have a length smaller than that of the third projected portion (74) in the front-and-back direction. In the display device, the strut portion (62) has the opening portion (64) which is opened from tips thereof in the longitudinal direction by a distance in the front-and-back direction exceeding the length of the third projected portion (74) such that the third projected portion (74) is interposed in the front-and-back direction and the recessed portion (65), which is recessed in the longitudinal direction and engages with the fourth projected portion (76) at a position on a side opposite to the opening portion (64), with a length in the front-and-back direction smaller than that of the third projected portion (74) and greater than that of the fourth projected portion (76).

In the display device according to an aspect of the present disclosure, either the two stands (6), each of which has the strut portion (62), are included, or the stand (6) has the two strut portions (62). In addition, the two attaching portions (7) are provided in parallel on the back portion of the holder (5), and the positions of the first side member (73) and the second side member (75) in the horizontal direction with respect to the strut portion (62) attached to each of the two attaching portions (7) are in reverse to each other.

In the display device according to an aspect of the present disclosure, the attaching portion (7) is shaped symmetrically in the longitudinal direction of the attached strut portion (62), and the strut portion (62) is shaped symmetrically in the front-and-back direction in a state of being attached.

In the display device according to an aspect of the present disclosure, the first side member (73) and the second side member (75) have the third projected portion (74) and the fourth projected portion (76) formed on portions that do not include the ends, and the strut portion (62) has a plurality of extended portions (66), which are the parts of tips of the strut portion (62) extended longer than other portions and tilted toward the center.

The television receiver according to an aspect of the present disclosure includes the display device according to an aspect of the present disclosure and the reception unit that receives a television broadcast, in which the display device displays a motion picture based on the television broadcast received with the reception unit.

In the present disclosure, the display device, which is also used as the television receiver, includes the stand (6) that has the strut portion (62) attached to the holder (5) which holds the display unit (3) and that holds the holder (5), and the attaching portion (7) for enclosing the back side and both horizontal sides of the strut portion (62) and attaching the strut portion (62). The attaching portion (7) has the first side member (73) on which the third projected portion (74) projecting toward the inside is formed in the longitudinal direction on one of both horizontal sides of the strut portion (62), and the second side member (75) on which the fourth projected portion (76) shorter than the third projected portion (74) in the front-and-back direction is formed in the longitudinal direction. In the strut portion (62), the opening portion (64), which is opened by a distance in the front-and-back direction exceeding the length of the third projected portion (74), is formed in the longitudinal direction, and the recessed portion (65), which has a length in the front-and-back direction smaller than that of the third projected portion (74) and greater than that of the fourth projected portion (76) and is recessed from the outside, is formed at a position on a side opposite to the opening portion (64). At a time of attaching the strut portion (62), the position of the strut portion (62) is fixed by the third projected portion (74) being interposed in the opening portion (64) and the recessed portion (65) being engaged with the fourth projected portion (76). In a case where the strut portion (62) is intended to be attached in the reverse orientation, the recessed portion (65) interferes with the third projected portion (74), and thus the strut portion (62) cannot be attached. The strength of the attaching portion (7) improves by the third projected portion (74) and the fourth projected portion (76) being formed. Therefore, the rigidity of the entire display device, in which the stand (6) supports the holder (5), is secured by the strut portion (62) being attached to the attaching portion (7) of which strength is improved.

In addition, in the present disclosure, the two strut portions (62) are attached to the two attaching portions (7) that are provided on the holder (5) in parallel. The positions of the first side member (73) and the second side member (75) of the two attaching portions (7) are in reverse to each other. For this reason, the positions of the opening portion (64) and the recessed portion (65) of the two attached two strut portions (62) are in reverse to each other. The structures of the two attaching portions (7) and strut portions (62) are bilaterally symmetrical, and the holder (5) is supported in good balance by the two stands (6).

In addition, in the present disclosure, the attaching portion (7) is shaped symmetrically in the longitudinal direction, and the strut portion (62) is shaped symmetrically in the front-and-back direction at the time of being attached. The two attaching portions (7) can be common components by being attached to the chassis (5) with up and down reversed. In addition, the strut portion (62) which can be attached to one attaching portion (7) can also be attached to the other attaching portion (7) with front and back reversed, and thus the two strut portions (62) can be common components.

In addition, in the present disclosure, the third projected portion (74) and the fourth projected portion (76) are formed on portions that do not include the ends of the first side member (73) and the second side member (75). In addition, a plurality of the extended portions (66) are provided on the tips of the strut portion (62) such that the extended portions (66) are tapered. The work of inserting and attaching the strut portion (62) to the attaching portion (7) is easy since the ends of the attaching portion (7) are wide and the tips of the strut portion (62) are narrow.

(Appendix 1)

A display device including:

a display unit that displays a motion picture on a front side;

a holder that holds the display unit;

a stand that has a strut portion attached along a back portion of the holder and supports the holder; and an attaching portion for enclosing a back side and both horizontal sides of the strut portion and attaching the strut portion to the holder, in which the attaching portion has a plate-like back side member which is positioned in back of the attached strut portion, a plate-like first side member which is positioned at one of both horizontal sides of the strut portion and in which a first projected portion, a part of the first side member projecting toward the inside, is formed in a longitudinal direction of the strut portion, and a plate-like second side member which is positioned at the other one of both horizontal sides of the strut portion and in which a second projected portion, a part of the second side member projecting toward the inside, is formed in the longitudinal direction of the strut portion so as to have a length in a front-and-back direction smaller than that of the first projected portion, and in which the strut portion has an opening portion which is opened from tips thereof in the longitudinal direction by a distance exceeding a length of the first projected portion in the front-and-back direction such that the first projected portion is interposed in the front-and-back direction, and a recessed portion, which is recessed in the longitudinal direction and engages with the second projected portion at a position on a side opposite to the opening portion, with a length in the front-and-back direction being smaller than that of the first projected portion and greater than that of the second projected portion.

(Appendix 2)

The display device according to Appendix 1, in which either two stands, each of which has the strut portion, are included, or the stand has two strut portions, in which two attaching portions are provided in parallel on the back portion of the holder, and positions of the first side member and the second side member in a horizontal direction with respect to the strut portion attached to each of the two attaching portions are in reverse to each other.

(Appendix 3)

The display device according to Appendix 2, in which the attaching portion is shaped symmetrically in the longitudinal direction of the attached strut portion, and in which the strut portion is shaped symmetrically in the front-and-back direction in a state of being attached.

(Appendix 4)

The display device according to any one of Appendices 1 to 3, in which the first side member and the second side member have the first projected portion and the second projected portion formed on portions that do not include ends, and the strut portion has a plurality of extended portions, which are parts of tips of the strut portion extended longer than other portions and tilted toward the center.

(Appendix 5)

A television receiver including:

the display device according to any one of Appendices 1 to 4; and the reception unit that receives a television broadcast, in which the display device displays a motion picture based on the television broadcast received with the reception unit.

It is to be noted that, as used herein and in the appended claims, the singular forms "a", "an", and "the" include plural referents unless the context clearly dictates otherwise.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

The invention claimed is:

1. A display device comprising:

a display that displays an image on a front side;

a holder that is positioned in back of the display and holds the display;

a first stand including a first strut;

a second stand including a second strut;

a first fixing portion that is attached to a back surface of the holder; and a second fixing portion that is attached to the back surface of the holder, wherein the first strut is positioned within the first fixing portion to fix the first strut to the holder, the second strut is positioned within the second fixing portion to fix the second strut to the holder, each of the first strut and the second strut includes:

a back portion, a first side portion, and
a second side portion, the first side portion and the second side portion opposing each other and extending horizontally from the back portion,
each of the first fixing portion and the second fixing portion includes:
a first plate member
a second plate member extending from the first plate member, and including a first projected portion defined along an axial direction of the respective strut, and
a third plate member extending from the first plate member and opposing the second plate member, and including a second projected portion defined along the axial direction of the respective strut,
the first projected portion projects inwardly towards the third plate member, and the second projected portion projects inwardly towards the second plate member,
a position of the second projected portion is closer to the first plate member than a position of the first projected portion,
a position of the second plate member and the third plate member of the first fixing portion, and a position of the second plate member and the third plate member of the second fixing portion are in reverse to each other with respect to the respective first plate members, such that when the first fixing portion and the second fixing portion are attached to the back surface of the holder, the third plate members of the first fixing portion and the second fixing portion oppose each other,
a position of the first side portion and the second side portion of the first strut, and a position of the first side portion and the second side portion of the second strut are in reverse to each other with respect to the respective back portions, and
when the first strut and the second strut are positioned within the first fixing portion and the second fixing portion respectively, the first plate members are substantially parallel to the back portions of the respective struts, the second plate members are opposite to the first side portions of the respective struts, and the third plate members are opposite to the second side portions of the respective struts, thereby allowing entry of the first strut into the first fixing portion, but not into the second fixing portion, and allowing entry of the second strut into the second fixing portion, but not into the first fixing portion.

2. The display device according to claim 1, wherein each of the first strut and the second strut includes:
a first groove defined along the axial direction in the first side portion and engaging with the first projected portion, and
a second groove defined along the axial direction in the second side portion and engaging with the second projected portion.

3. The display device according to claim 1, wherein
a penetration portion through which a screw is configured to fix the respective strut is defined in the first plate member of each of the first fixing portion and the second fixing portion,
a screw hope is defined in the back portion of each of the first strut and the second strut to receive the screw, and
a screw hole is not defined in a front side of the first strut and the second strut.

4. A television receiver comprising:
the display device according to claim 1,
wherein the display device displays a motion picture based on a television broadcast received via a reception unit of the display device.

* * * * *